(12) United States Patent
Kim et al.

(10) Patent No.: US 11,848,563 B2
(45) Date of Patent: Dec. 19, 2023

(54) ELECTRONIC DEVICE COMPRISING WIRELESS CHARGING MODULE AND FLEXIBLE DISPLAY

(71) Applicant: Samsung Electronics Co., Ltd., Gyeonggi-do (KR)

(72) Inventors: Yongyoun Kim, Gyeonggi-do (KR); Kyungmoon Seol, Gyeonggi-do (KR); Minsung Lee, Gyeonggi-do (KR); Jinwoo Jung, Gyeonggi-do (KR); Soyoung Lee, Gyeonggi-do (KR); Jaebong Chun, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 653 days.

(21) Appl. No.: 17/043,145

(22) PCT Filed: Apr. 2, 2019

(86) PCT No.: PCT/KR2019/003842
§ 371 (c)(1),
(2) Date: Sep. 29, 2020

(87) PCT Pub. No.: WO2019/194520
PCT Pub. Date: Oct. 10, 2019

(65) Prior Publication Data
US 2021/0135492 A1    May 6, 2021

(30) Foreign Application Priority Data

Apr. 4, 2018  (KR) .......................... 10-2018-0039144

(51) Int. Cl.
*H05K 1/02*  (2006.01)
*H05K 1/03*  (2006.01)
(Continued)

(52) U.S. Cl.
CPC .......... *H02J 50/005* (2020.01); *G06F 1/1643* (2013.01); *G06F 1/1652* (2013.01);
(Continued)

(58) Field of Classification Search
CPC ........ H05K 1/028; H05K 1/0283; H05K 1/02; H05K 1/03; H05K 5/0017; H05K 5/0026;
(Continued)

(56) References Cited

U.S. PATENT DOCUMENTS 9,565,366 B2 *  2/2017  Yamazaki ............... G09F 9/301
10,185,064 B2 *  1/2019  Powell .................. G06F 1/1637
(Continued)

FOREIGN PATENT DOCUMENTS

CN  101459981 A  6/2009
CN  102902308 A  1/2013
(Continued)

OTHER PUBLICATIONS

KR OA dated May 20, 2022.
(Continued)

*Primary Examiner* — Xiaoliang Chen
(74) *Attorney, Agent, or Firm* — Cha & Reiter, LLC

(57) ABSTRACT

An electronic device of an embodiment of the present invention may comprise: a first structure comprising a first plate including a first surface and a second surface facing away from the first surface; a second structure comprising a second plate facing the second surface of the first plate, a first sidewall perpendicular to the second plate, a second sidewall perpendicular to the first sidewall and the second plate, and a third sidewall perpendicular to the first sidewall and the second plate and parallel to the second sidewall, wherein the first sidewall includes a conductive portion, and the second plate, the first sidewall, the second sidewall, and
(Continued)

the third sidewall together form a trough with one side open to receive at least a portion of the first structure, and the first structure is movable between an open state and a closed state with respect to the second structure in a first direction parallel to the second plate and the second sidewall such that the first structure is located at a first distance from the first sidewall in the closed state and is located at a second distance greater than the first distance from the first sidewall in the open state; a flexible touch screen display layer comprising: a planar portion extending across at least a portion of the first surface and mounted to the first surface; and a bendable portion extending, during the closed state, from the planar portion into a space between the first sidewall and the first structure, wherein when the first structure is moved from the closed state to the open state, at least a portion of the bendable portion forms a substantially planar surface between the planar portion and the first sidewall as viewed from the top of the first plate; a conductive pattern mounted on the second plate between the second surface and the second plate; a first conductive path extending between the conductive portion of the first sidewall and the conductive pattern; a printed circuit board mounted on the first structure; a wireless charging circuit mounted on the printed circuit board; a wireless communication circuit mounted on the printed circuit board; and a flexible conductive path connected between the printed circuit board and the conductive pattern, wherein the flexible conductive path includes a second conductive path electrically connected between the wireless charging circuit and the conductive pattern, and a third conductive path electrically connected between the communication circuit and the first conductive path.

7 Claims, 21 Drawing Sheets

(51) Int. Cl.

| | | |
|---|---|---|
| *G06F 3/041* | (2006.01) | |
| *G09F 9/00* | (2006.01) | |
| *G09F 9/30* | (2006.01) | |
| *H02J 50/00* | (2016.01) | |
| *H02J 50/10* | (2016.01) | |
| *H02J 50/70* | (2016.01) | |
| *G06F 1/16* | (2006.01) | |
| *H02J 7/02* | (2016.01) | |
| *H05K 5/00* | (2006.01) | |
| *H05K 5/02* | (2006.01) | |
| *H05K 9/00* | (2006.01) | |

(52) U.S. Cl.
CPC ............... *H02J 7/02* (2013.01); *H02J 50/10* (2016.02); *H02J 50/70* (2016.02); *H05K 5/0017* (2013.01); *H05K 5/0086* (2013.01); *H05K 5/0217* (2013.01); *H05K 5/0247* (2013.01); *H05K 9/0054* (2013.01); *G06F 3/041* (2013.01); *G06F 2203/04102* (2013.01)

(58) Field of Classification Search
CPC .. H05K 5/0086; H05K 5/0217; H05K 5/0247; H05K 9/0054; G06F 1/1622; G06F 1/1624; G06F 1/1626; G06F 1/1637; G06F 1/1641; G06F 1/1643; G06F 1/1652; G06F 1/1681; G06F 1/1694; G06F 3/041; G06F 3/0416; G06F 3/0446; G06F 3/14; G06F 2203/04102; G09F 9/00; G09F 9/30; G09F 9/301
USPC ..... 361/749, 679.01; 345/520, 667; 348/725
See application file for complete search history.

(56) References Cited

U.S. PATENT DOCUMENTS

| | | | |
|---|---|---|---|
| 10,185,365 B2* | 1/2019 | Yang | G09F 9/301 |
| 10,497,964 B1* | 12/2019 | Holmdahl | H01M 50/105 |
| 11,243,634 B2* | 2/2022 | Ko | G06F 3/0446 |
| 2004/0183958 A1* | 9/2004 | Akiyama | G09F 9/30 349/58 |
| 2013/0058063 A1 | 3/2013 | O'Brien | |
| 2014/0063351 A1* | 3/2014 | Sato | G06F 1/1652 361/679.01 |
| 2014/0117928 A1 | 5/2014 | Liao | |
| 2014/0211399 A1 | 7/2014 | O'Brien | |
| 2014/0226275 A1 | 8/2014 | Ko et al. | |
| 2015/0207207 A1 | 7/2015 | Park et al. | |
| 2015/0220118 A1* | 8/2015 | Kwak | H04M 1/0268 345/520 |
| 2015/0366089 A1 | 12/2015 | Park et al. | |
| 2016/0079658 A1 | 3/2016 | Jung et al. | |
| 2016/0209970 A1* | 7/2016 | Lee | G09F 9/301 |
| 2016/0320804 A1* | 11/2016 | Takayanagi | H04M 1/0268 |
| 2017/0045996 A1* | 2/2017 | Ka | G09G 3/035 |
| 2017/0064847 A1* | 3/2017 | Lim | G09F 9/30 |
| 2017/0098794 A1* | 4/2017 | Cho | H10K 50/80 |
| 2017/0139442 A1* | 5/2017 | Yoshizumi | G06F 1/1643 |
| 2017/0285844 A1 | 10/2017 | Park et al. | |
| 2018/0004251 A1* | 1/2018 | Magi | H10K 50/87 |
| 2018/0062275 A1 | 3/2018 | Kim et al. | |
| 2018/0138746 A1 | 5/2018 | Jang | |
| 2018/0182839 A1* | 6/2018 | Lee | H01L 23/52 |
| 2018/0343754 A1* | 11/2018 | Lee | H05K 1/0283 |
| 2019/0012000 A1* | 1/2019 | Cavallaro | G06F 1/1626 |
| 2019/0258301 A1* | 8/2019 | Feliconio Pereira | G06F 1/1686 |

FOREIGN PATENT DOCUMENTS

| | | |
|---|---|---|
| CN | 103219808 A | 7/2013 |
| CN | 106059017 A | 10/2016 |
| CN | 107526395 A | 12/2017 |
| EP | 2071695 A2 | 6/2009 |
| EP | 3 258 675 A1 | 12/2017 |
| EP | 3258675 A1 | 12/2017 |
| EP | 3747247 A1 | 12/2020 |
| KR | 10-2009-0062224 A | 6/2009 |
| KR | 10-2011-0126259 A | 11/2011 |
| KR | 10-2014-0011955 A | 1/2014 |
| KR | 10-2014-0059274 A | 5/2014 |
| KR | 10-2014-0086363 A | 7/2014 |
| KR | 10-2014-0102619 A | 8/2014 |
| KR | 10-2015-0142290 A | 12/2015 |
| KR | 10-2016-0135677 A | 11/2016 |
| KR | 10-2017-0048258 A | 5/2017 |
| KR | 10-2017-0141438 A | 12/2017 |
| KR | 10-2018-0025126 A | 3/2018 |
| WO | 2019/198978 A1 | 10/2019 |

OTHER PUBLICATIONS

Notice of Patent Grant dated Jul. 27, 2022.
European Search Report dated Jul. 29, 2021.
Chinese Office Action dated May 20, 2023.
EP Intention to Grant dated May 23, 2023.

* cited by examiner

ELECTRONIC DEVICE COMPRISING WIRELESS CHARGING MODULE AND FLEXIBLE DISPLAY

CROSS-REFERENCE TO RELATED APPLICATION(S)

This application is a National Phase Entry of PCT International Application No. PCT/KR2019/003842, which was filed on Apr. 2, 2019, and claims priority to Korean Patent Application No. 10-2018-0039144, which was filed on Apr. 4, 2018, the contents of which are incorporated herein by reference.

TECHNICAL FIELD

Various embodiments of the disclosure relate to an electronic device including a wireless charging module and a flexible display.

BACKGROUND ART

Electronic devices may include a wireless charging module and a flexible display. It is possible to change the size of the screen for displaying in electronic devices using a flexible display. The battery in electronic devices can be charged using a wireless charging module. A wireless charging module may include a charging coil made of a conductive material, and a shielding material. The charging coil, generally, may be composed of a plurality of layers and may have a thickness of 1 oz (36 um)~3 oz (108 um) to follow the tendency of reduction of the thickness.

DISCLOSURE OF INVENTION

Technical Problem

When a flexible display and a wireless charging module are included in an electronic device, the space for the wireless charging module may be insufficient. For example, the space between the rear surface of an electronic device and an expansion display of a flexible display is insufficient, so the space for a wireless charging module may be insufficient. Further, it may be difficult to connect a wireless communication antenna of the electronic device to a communication circuit on a printed circuit board due to the expansion display of the flexible display.

According to various embodiments of the disclosure, a wireless charging antenna and a communication antenna are designed to be shared in an electronic device, so the performance of each of the antennas can be secured.

According to various embodiments of the disclosure, charging and communicating functions are both implemented on one flexible circuit board in an electronic device, so a wireless charging function can be implemented.

Solution to Problem

According to various embodiments of the disclosure, an electronic device may include: a first structure including a first plate having a first surface and a second surface opposite the first surface; a second structure including a second plate facing the second surface of the first plate, a first side wall perpendicular to the second plate, a second side wall perpendicular to the first side wall and the second plate, and a third side wall perpendicular to the first side wall and the second plate and parallel with the second side wall in which the first side wall has a conductive portion, and the second plate, the first side wall, the second side wall, and the third side wall form a trough having an open side to accommodate at least a portion of the first structure, the first structure can move between an open state and a closed state with respect to the second structure in a first direction parallel with the second plate and the second side wall, and the second structure is positioned at a first distance from the first side wall when the first structure is in the closed state, and is positioned at a second distance larger than the first distance from the first side wall in the open state; a display layer being a flexible touch screen display layer, having a flat portion extending across at least a portion of the first surface and mounted on the first surface and a bendable portion extending in a space between the first side wall and the first structure from the flat portion in the closed state in which when the first structure is moved into the open state from the closed state, at least a portion of the bendable portion forms a substantially flat surface between the flat portion and the first side wall when seen from above the first plate; a conductive pattern mounted on the second plate between the second surface and the second plate; a first conductive path extending between the conductive portion of the first side wall and the conductive pattern; a printed circuit board mounted in the first structure; a wireless charging circuit mounted on the printed circuit board; a wireless communication circuit mounted on the printed circuit board; and flexible conductive paths connected between the printed circuit board and the conductive pattern and including a second conductive path electrically connected between the wireless charging circuit and the conductive pattern and a third conductive path electrically connected between the communication circuit and the first conductive path.

According to various embodiments, an electronic device may include: a housing having a first cover disposed in a first direction, a second cover disposed in a second direction opposite to the first direction, and a plurality of side walls surrounding at least a portion of a space between the first and second covers; a first structure disposed in at least a portion of the first plate of the housing to slide up/down; a flexible display mounted in the first structure to be at least partially exposed, having a display region expanding when the first structure is slid up, and having a bendable portion that is hidden into the housing when the first structure is slid down; a wireless charging antenna including at least one or more coils disposed in the first structure; at least one or more wireless communication antenna disposed in the housing; and a flexible circuit unit bent at least one or more times, operating in correspondence to sliding-up or sliding-down of the first structure, and connecting the wireless charging antenna and the communication antenna.

Advantageous Effects of Invention

According to various embodiments of the disclosure, in an electronic device including a flexible display, the spatial efficiency of an antenna device performing wireless charging and wireless communication functions can be improved.

According to various embodiments of the disclosure, in an electronic device including a flexible display, an antenna device performing the function of a wireless charging antenna and a wireless communication function is disposed on one flexible circuit, so the spatial efficiency of the antenna device can be improved.

According to various embodiments of the disclosure, in an electronic device including a flexible display, a shielding material layer that shields the space between a bendable portion of the flexible display and an antenna device is included for isolation, so noises generated toward each other are blocked, whereby it is possible to prevent deterioration of the performance of the antenna device and the flexible display.

BEST MODE FOR CARRYING OUT THE INVENTION

Hereinafter, various embodiments of the disclosure will be described with reference to the accompanying drawings. However, it should be appreciated that they are not intended to limit the disclosure to particular embodiments, and include various modifications, equivalents, and/or alternatives for the embodiments of the disclosure.

An electronic device according to various embodiments of the disclosure may, for example, include at least one of a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device (e.g., smart glasses, head-mounted device (HMD)), electronic clothing, electronic bracelet, electronic necklace, electronic accessory (appcessory), electronic tattoo, smart mirror, or smart watch).

Figure 1:
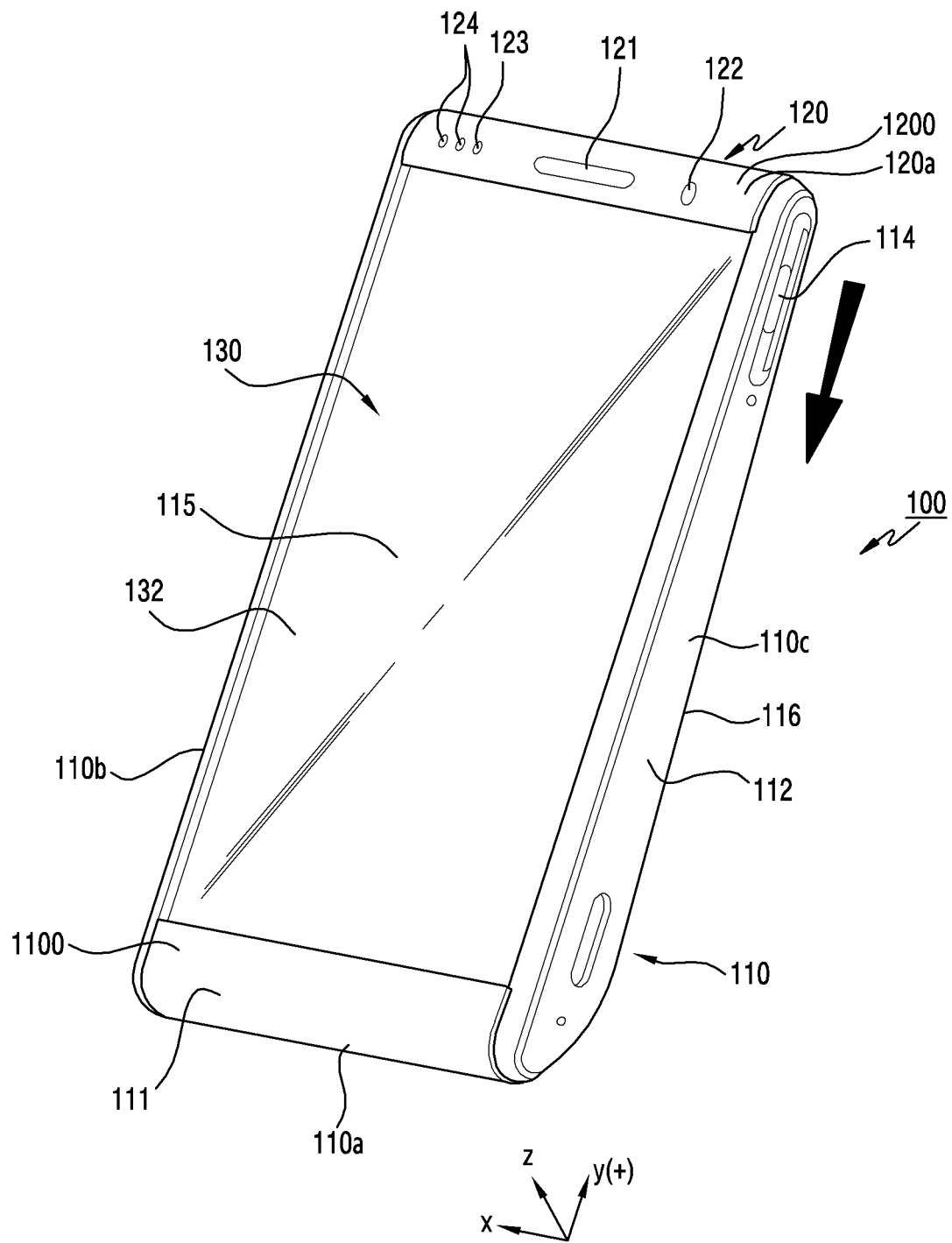
FIG. 1 is a perspective view showing an electronic device with a first structure closed (slid down) in accordance with various embodiments of the disclosure.
Figure 2:
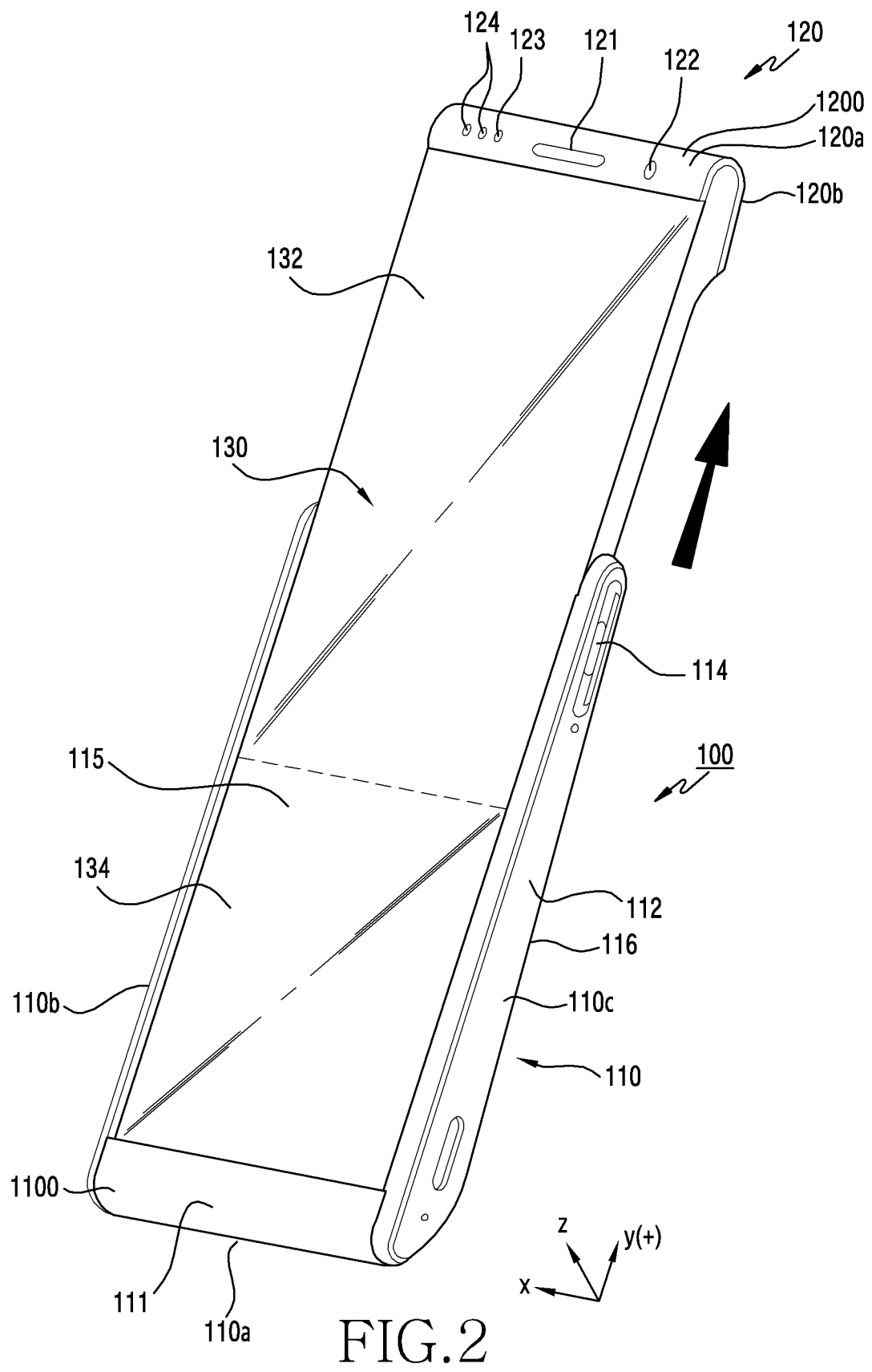
FIG. 2 is a perspective view showing the electronic device with the first structure open (slid up) and a display region expanded in accordance with various embodiments of the disclosure.

FIG. 1 is a perspective view showing an electronic device with a first structure slid down (closed) in accordance with various embodiments of the disclosure. FIG. 2 is a perspective view showing the electronic device with the first structure slid up (open) and a display region expanded in accordance with various embodiments of the disclosure.

Referring to FIGS. 1 and 2, according to various embodiments of the disclosure, an electronic device 100 may include a second structure 110, a first structure 120, and a flexible display layer 130. The first structure 120 can be retracted (closed) into or protruded (opened) out of the second structure 110. FIG. 1 is a view showing the state in which the first structure 120 is closed in the second structure and FIG. 2 is a view showing the state in which the second structure 120 is opened out of the second structure 110. The X-axis may be the transverse direction of the electronic device, the Y-axis may be the longitudinal direction of the electronic device 100, and the Z-axis may be the width direction of the electronic device 100. The +Y-axis may be the opening (protruding) direction of the first structure 120, the −Y-axis may be the closing (retracting) direction of the first structure 120, and the X-axis may the direction of the rotational axes of first and second roller to be described below (the arrange direction of protrusions).

The first structure 120 may include a first plate 1200. For example, the first plate 1200 may have a first surface 120a and a second surface 120b opposite the first surface 120a.

According to various embodiments, the second structure 110 may include a housing 111. According to various embodiments, the housing 111 may include a first cover 115 facing a first direction, a second cover 116 facing a second direction that is opposite to the first direction, and a plurality of side walls 110a~110c or side members 112 surrounding at least a portion of a space surrounded by the first and second covers 115 and 116. The first direction may be the +Z-axial direction and the second direction may be the −Z-axial direction. For example, the flexible display layer 130 may be disposed on the first structure 120 to be exposed in the first direction.

According to an embodiment, the second structure 110 may include a second plate 1100. The second plate 1100 may be disposed to at least partially face the second surface 120*b* of the first plate 1200. The second structure 110 may have a first side wall 110*a* perpendicular to the second plate 1100, a second side wall 110*b* perpendicular to the first side wall 110*a* and the second plate 1100, and a third side wall 110*c* perpendicular to the first side wall 110*a* and the second plate 1100 and parallel with the second side wall 110*b*.

Figure 5A:
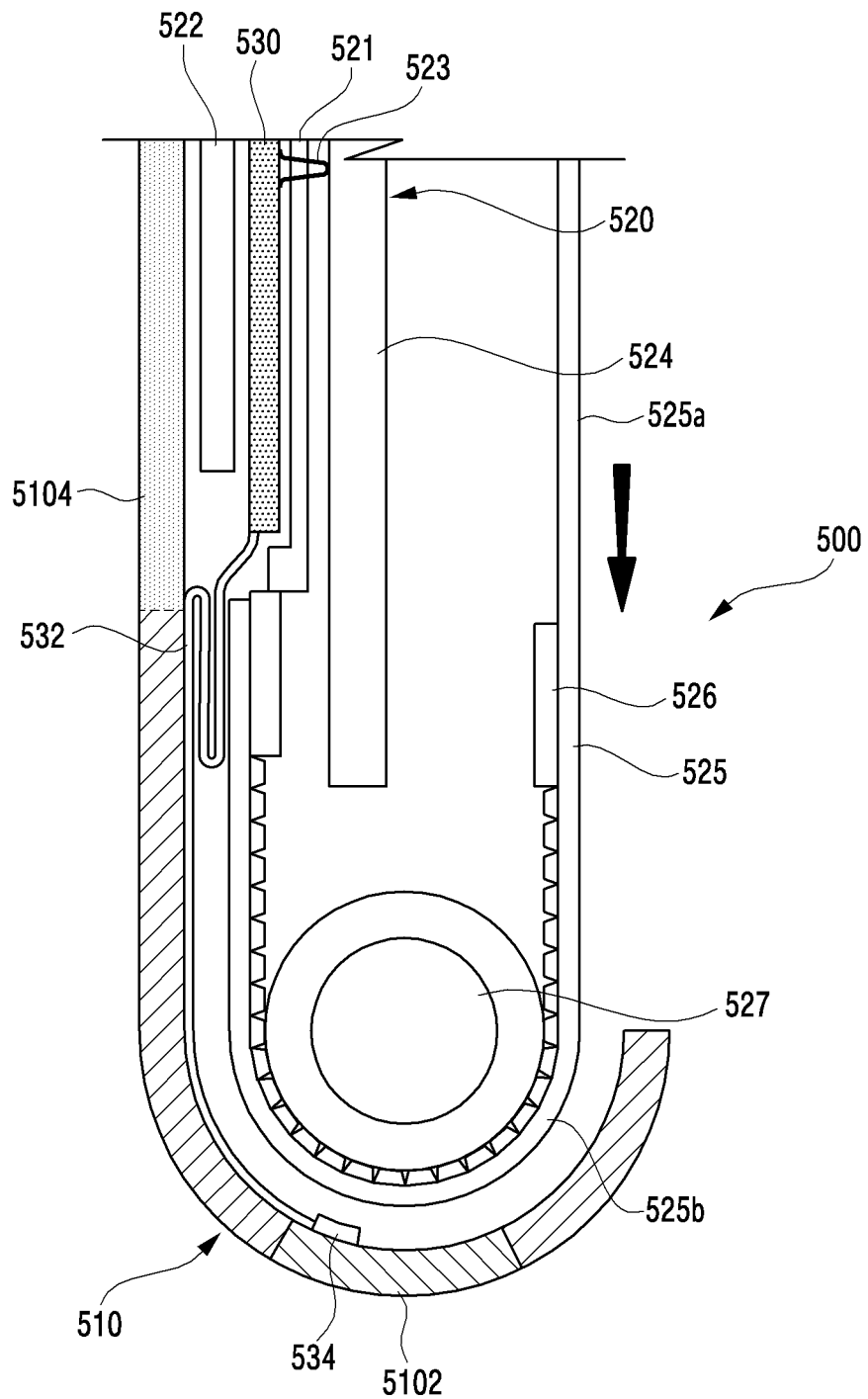
FIG. 5A is a cross-sectional view showing the structure around an antenna included an electronic device including an antenna device in a closed state in accordance with various embodiments.

According to various embodiments, the first side wall 110*a* may have a conductive portion (e.g., the wireless communication antenna 5102 shown in FIG. 5A). For example, the conductive portion is an outer metal frame, is formed in a folded type, and can operate as an antenna radiator having a predetermined band.

According to various embodiments, the second structure 110 of the housing 111 may have a trough including one side opening (e.g. the side opening 310*d* shown in FIG. 3) such that the second plate 1100, the first side wall 110*a*, the second side wall 110*b*, and the third side wall 110*c* accommodate together at least a portion of the first structure 120. The side opening 310*d* may be referred to as the trough.

According to various embodiments, the first structure 120 can move between an open state (e.g., a sliding-up position) and a closed state (e.g., a sliding-down position) with respect to the second structure 110 in a first direction parallel with the first plate 1200 and the second side wall 110*b*.

According to various embodiments, the first structure 120 may be positioned at a first position from the first side wall 110*a* in the closed state and may be positioned at a second position larger (farther) than the first position from the first side wall 110*a*.

According to various embodiments, the housing 111 may include a printed circuit board (not shown) (e.g., the printed circuit board 524 shown in FIG. 5), a battery, an antenna, a connector hole, and one or more key input devices.

According to various embodiments, the key input devices may include a home key (not shown) disposed on the housing 111 and/or a side key button 114 disposed on the side members 112 of the housing 111. In another embodiment, the electronic device 100 may not include some or all of the key input devices described above and the non-included key input devices may be implemented in a soft key type on the flexible display layer 130.

According to various embodiments, the connector hole (not shown) may include a first connector hole (not shown) that can accommodate a connector (e.g., a USB connector) for transmitting and receiving power and/or data to and from external electronic devices and/or a second connector hole (not shown) (e.g., an earphone jack) that can accommodate a connector for transmitting and receiving audio signals to and from external electronic devices.

According to various embodiments, the first structure 120 can move parallel into the open state from the housing 111 (e.g., see FIG. 2) and can move into the closed state (e.g., see FIG. 1) from the open state. For example, the power source that closes (retracts) or opens (protrudes) the first structure 120 may be implemented in a manual, semiautomatic, or automatic type. When the power source that closes/opens the first structure 120 is implemented in a semiautomatic type, the semiautomatic power source may be an elastic member, and when power source that closes/opens the first structure 120 is an automatic type, it may be a gear mechanism or a driving motor (e.g., see FIG. 9).

According to various embodiments, when the first structure 120 is protruded from the first housing 111, the display region of the flexible display layer 130 of the electronic device 100 can be expanded. For example, the display layer 130 may have a flat portion 132 (e.g., a region that is always exposed) and a bendable portion 134 (e.g., an expansion display region that expands when the first structure 120 is opened (protruded)). For example, the display layer 130 may include a flexible display. Hereafter, the display layer 130 is referred to as a flexible display.

According to various embodiments, the flexible display 130 may be mounted on the top of the first structure 120 to be at least partially exposed and has an end fixed to the first structure 120, so when the first structure 120 is protrude, the end of the flexible display 130 is pulled in the opening (protruding) direction, so the display region can be expanded. When the first structure 120 is closed (retracted), the bendable portion 134 can be inserted into the housing 111. According to an embodiment, a receiver 121, a camera module 122, an indicator 123, and a sensor 124 may be disposed on the top of the first structure 120. With the receiver 121 therebetween, the cameral module 122 may be disposed at a side and the indicator 123 and sensor 124 may be disposed at the other side.

According to various embodiments, the flexible display 130 may be implemented as a flexible touch screen display by including a touch screen panel.

According to various embodiments, the flexible display 130 may extend across at least a portion of the first surface 120*a* and may have a flat portion 132 positioned on the first surface 120*a* and a bendable portion 134 extending into the space between the first side wall 110*a* and the first structure from the flat portion 132 in the closed state.

According to various embodiments, when the first structure 120 (first structure) moves from the closed state into the open state, a least a portion of the bendable portion 134 can be pulled into the housing 111 to from a substantially flat surface between the flat portion 132 and the first side wall 110*a* when the first plate 1200 is seen from above.

According to various embodiments, the camera 122 may include one or more lenses, an image sensor, and/or an image signal processor. A rear camera or a flash that is not shown may be disposed on a second cover, for example, the rear surface of the housing. The flash, for example, may include a light emitting diode or a xenon lamp. In an embodiment, two or more lenses (a wide-angle lens and a telephoto lens) and image sensors may be disposed on one surface of the electronic device 100.

According to various embodiments, the sensor 124 can generate an electrical signal or a data value corresponding to the internal operation state of the electronic device 100 or an external environmental state. The sensor 124 may include an optical sensor, for example, a proximity sensor and may include a fingerprint sensor or a biosensor that is not shown. For example, the fingerprint sensor may be disposed on a first surface (front surface) or a second surface (rear surface) of the housing 111. As another example, the electronic device 100 may further include at least one of sensors (not shown), for example, a gesture sensor, a gyro sensor, a barometer sensor, a magnetic sensor, an acceleration sensor, a grip sensor, a color sensor, an IR (Infrared) sensor, a temperature sensor, a humidity sensor, or an illumination sensor.

According to various embodiments, the indicator 123 may be disposed on the first surface of the first structure 120. The indicator 123, for example, can provide state information of the electronic device 100 using an optical type and may include an LED.

Figure 3:
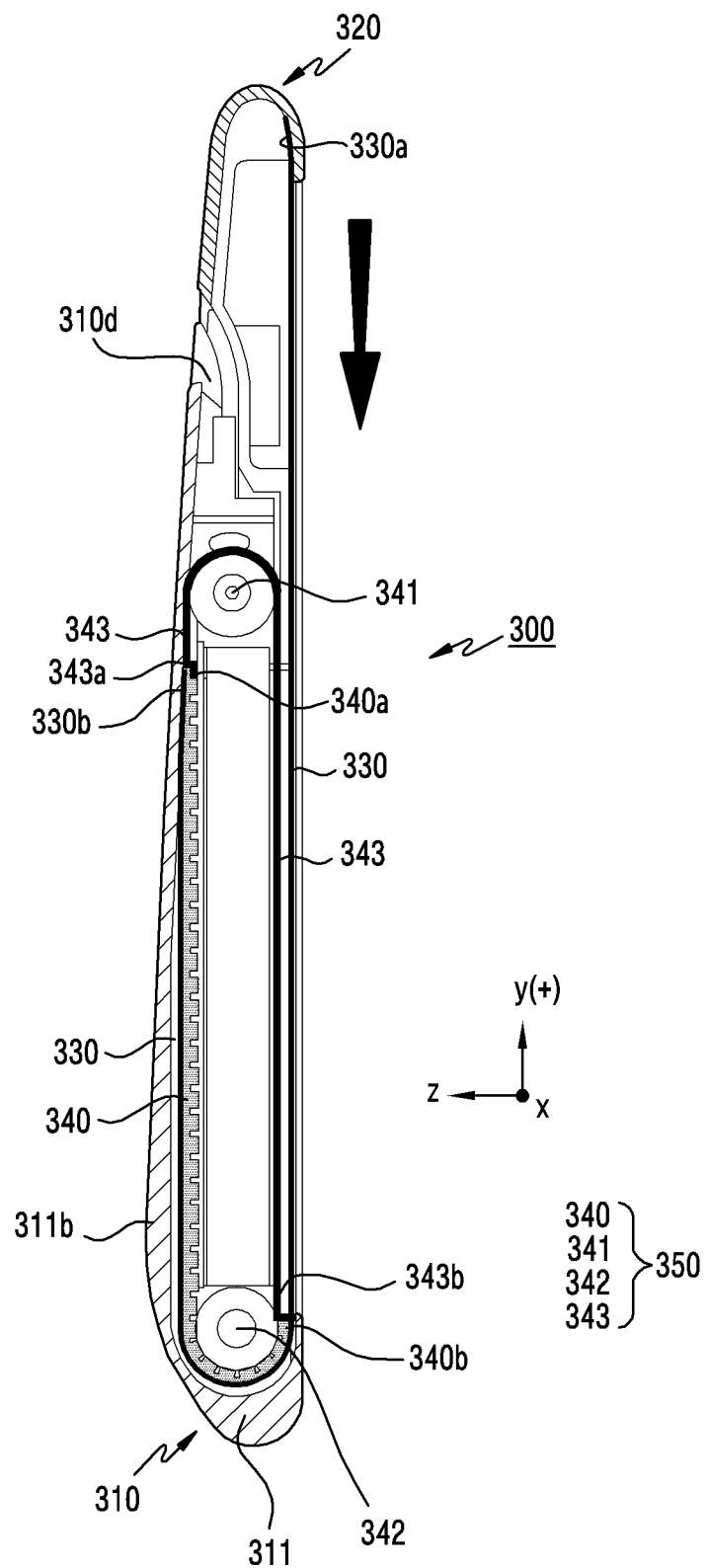
FIG. 3 is a cross-sectional view showing the electronic device with the first structure closed (slid down) in accordance with various embodiments of the disclosure.
Figure 4:
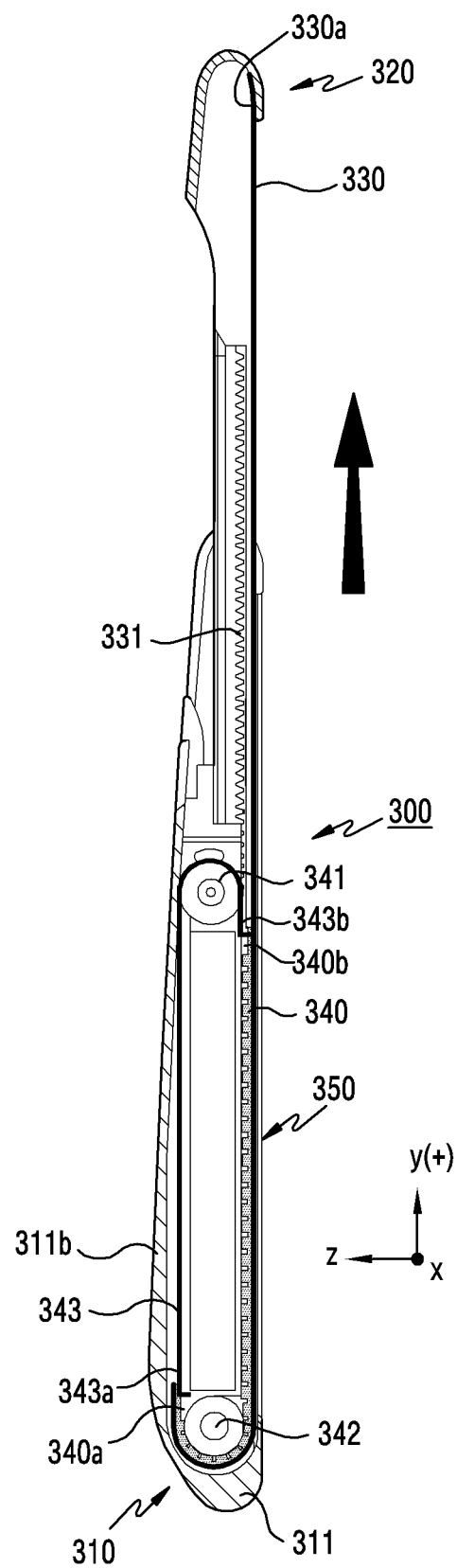
FIG. 4 is a cross-sectional view showing the electronic device with the first structure open (slid up) and the display region expanded in accordance with various embodiments of the disclosure.

FIG. 3 is a cross-sectional view showing the electronic device with the first structure closed in accordance with various embodiments of the disclosure. FIG. 4 is a cross-sectional view showing the electronic device with the first structure open and the display region expanded in accordance with various embodiments of the disclosure.

Referring to FIGS. 3 and 4, according to various embodiments of the disclosure, an electronic device 300 may be an electronic device that is the same as or similar to the electronic device 100 shown in FIGS. 1 and 2. According to various embodiments, the electronic device 300 may include a supporting member 340 or a flatness maintainer 350 to maintain flatness of a bendable portion (e.g., the bendable portion 134 shown in FIG. 1) of a flexible display 330 (e.g., the flexible display 130 shown in FIG. 1) when a first structure 320 (e.g., the first structure 120 shown in FIG. 1) is protruded out of a housing 311.

According to various embodiments, the supporting member 340, which is a support disposed on the rear surface of the bendable portion (e.g., the bendable portion 134 shown in FIG. 2) to function as a prop for the bendable portion when bendable portion is exposed to the outside, can serve to support the bendable portion. According to an embodiment, the supporting member 340 may be integrally formed with the bendable portion.

According to various embodiments, the flatness maintainer 350 can serve to maintain flatness of the supporting member 340 to maintain flatness of the bendable portion (e.g., the bendable portion 134 shown in FIG. 2) of the flexible display 330.

According to various embodiments, the flexible display 330 may be fixed to the first structure 320 at an end 330a and to a portion of the supporting member 340 at another end 330b. Accordingly, when the first structure 330 (e.g., the first structure 120 shown in FIG. 1) is opened (protruded) or closed (retracted), the bendable portion of the flexible display 330 and the supporting member 340 can be opened (protruded) out of the housing 311 (e.g., the housing 111 shown in FIG. 1) or closed (retracted) into the housing 311.

According to various embodiments, the flatness maintainer 350 may include first and second rollers 341 and 342 or a wire 343. The flatness maintainer 350 may be disposed between the flexible display 330 exposed to the outside and the rear surface 311b of the housing 311. The first rollers 341 are provided in a pair, the second roller 342 are provided in a pair, and the first and second rollers 341 and 342 may be disposed to face each other in the Y-direction. The first and second rollers 341 and 342 can be rotated in the housing 311 and each may include a bearing (not shown).

According to various embodiments, the flatness maintainer 350 may include first rollers 341 disposed at a first position in the housing 311, second rollers 342 disposed at a second position in the housing 311, or a wire 343 having a first end 343a and a second end 343b that are moved in opposite direction by the first rollers 341.

According to various embodiments, the first end 343a of the wire is connected to an end 340a of the supporting member 340 and the second end 343b of the wire is connected to another end 340b of the supporting member, whereby tension that pulls both ends of the supporting member 340 is provided. Accordingly, force that maintains the flatness of the supporting member 340 can be provided. The bendable portion of the flexible display 330 is disposed in close contact with the supporting member 340, so the structure maintaining the flatness of the supporting member 340 can maintain the flatness of the bendable portion. Both ends of the supporting member 340 are pulled away from each other by the wire 343, the supporting member 340 can be kept tensed. The tensed state (tight state) is the state in which the supporting member maintains tension, and may be referred to as flatness-maintained state.

According to various embodiments, various parts may be disposed in the space between the supporting member 340 and the wire 343 in the electronic device 300. For example, the parts disposed in the space in the housing 311 may include a printed circuit board, a battery, or an antenna.

According to various embodiments, the first end 343a and the second end 343b of the wire 343 can be moved in opposite directions by the first rollers 341. For example, when the first end 343a of the wire is moved toward the second rollers 342, the second end 343b of the wire can be moved close to the first rollers 341 from the vicinity of the second rollers 342. The first end 343a and the second end 343b of the wire can be moved in parallel with the flexible display 330 with a predetermined gap maintained therebetween. Elasticity is applied to the first rollers 341 away from the second rollers 342, so tension can always be maintained in the wire 343 and the supporting member 340.

According to various embodiments, the first rollers 341 are provided in a pair and can be disposed to be able to rotate on a first rotary shaft disposed perpendicular to the retracting/protruding direction substantially at the middle portion in the housing 311. According to various embodiments, the second rollers 342 can be disposed to be able to rotate on a second rotary shaft disposed perpendicular to the retracting/protruding direction substantially at the lower end portion in the housing 311. The first and second rollers 341 and 342 may be symmetrically disposed and may face each other. The first rollers 341 can operate with the wire 343 and the second rollers 342 can operate with the supporting member 340. As another example, the first rollers 341 can rotate in contact with the wire 343 and the second rollers 342 can rotate in contact with the supporting member 340. For example, when the first structure 320 is retracted or protruded, the first and second rollers 341 and 342 can be rotated, and the wire 343 and the supporting member 340 can be moved.

According to an embodiment, when the first structure 320 has been closed (retracted) in the housing 311 (e.g., see FIG. 3), a portion of the supporting member 340 may be in contact with the outer surfaces of the second rollers 342 and the other portions may be positioned close to the second cover 311b of the housing 311. When the first structure 320 has been opened (protruded) out of the housing 311 (e.g., see FIG. 4), a portion of the supporting member 340 may be in contact with the outer surfaces of the second rollers 342 and the other portion may be disposed as a prop for the bendable portion.

As another example, when the first structure 320 has been closed (retracted) in the housing 311, a portion of the wire 343 may be in contact with the outer surfaces of the first rollers 341 and the other portion may be positioned with a gap from the rear surface of the bendable portion. When the first structure 320 has been opened (protruded) out of the housing 311, a portion of the wire 343 may be in contact with the outer surfaces of the first rollers 341 and the other portion may be positioned close to the second cover 311b of the housing.

Figure 5B:
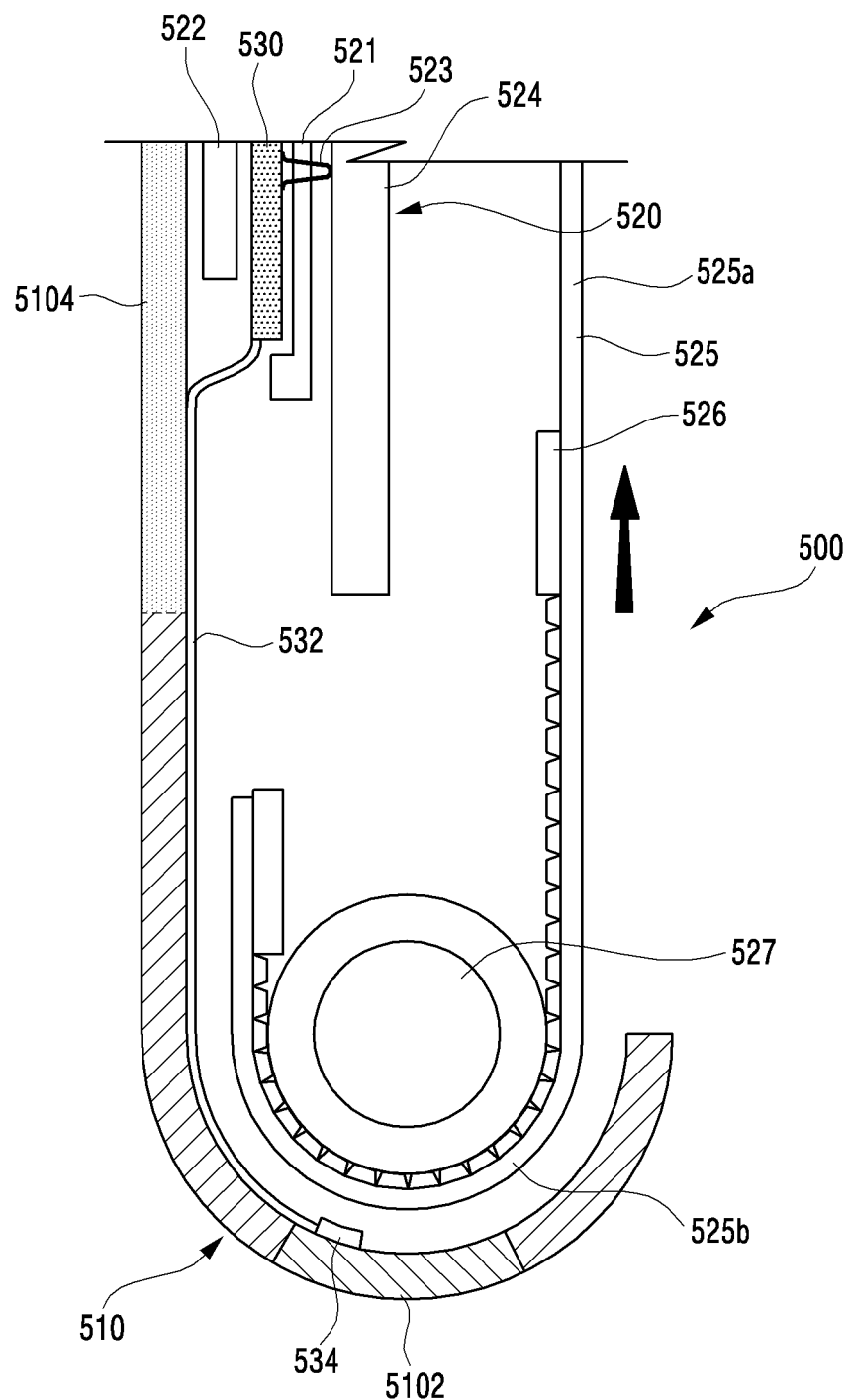
FIG. 5B is a cross-sectional view showing the structure around the antenna of the electronic device including an antenna device in an open state in accordance with various embodiments of the disclosure.
Figure 5C:
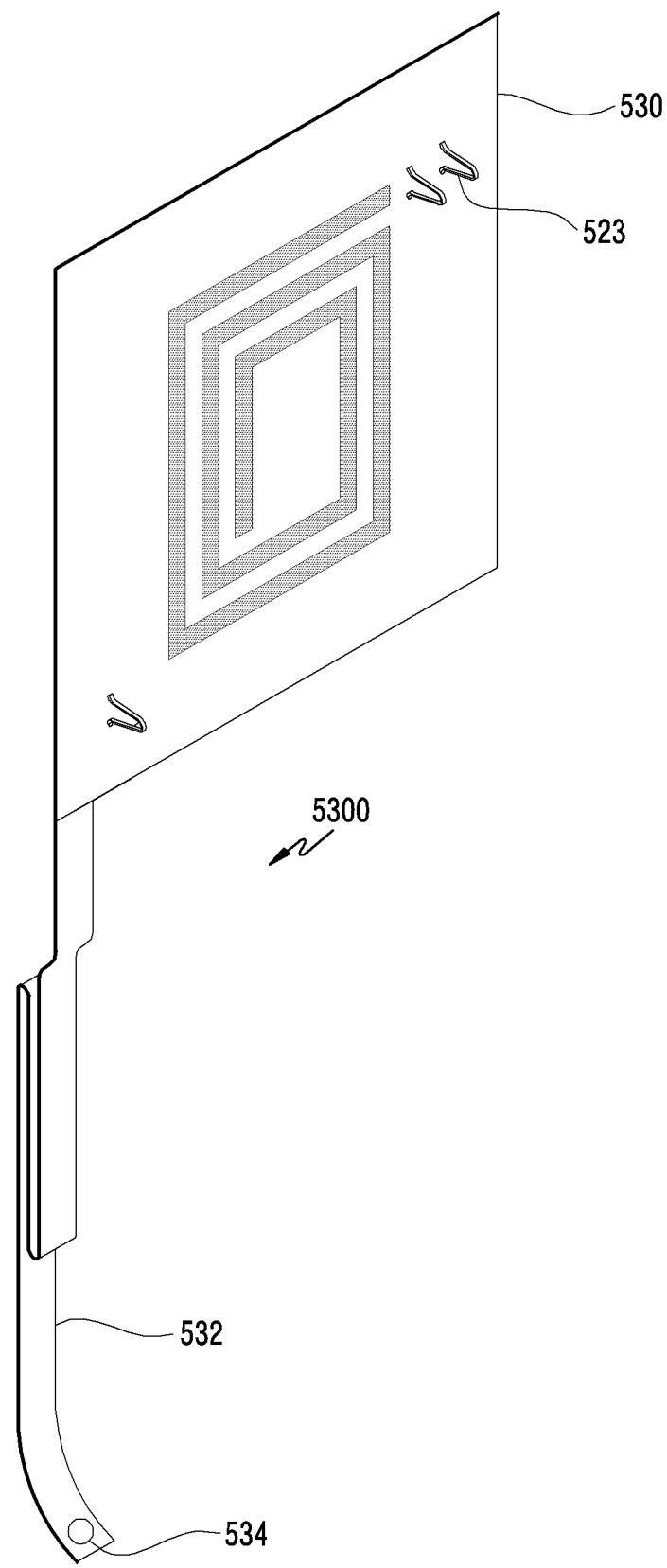
FIG. 5C is a perspective view showing an antenna device according to various embodiments of the disclosure.

FIG. 5A is a cross-sectional view showing the structure around an antenna included an electronic device including an antenna device in a closed state in accordance with various embodiments of the disclosure. FIG. 5B is a cross-sectional view showing the structure around the antenna of the electronic device having an antenna device in an open state in accordance with various embodiments of the disclosure. FIG. 5C is a perspective view showing an antenna device according to various embodiments of the disclosure.

Referring to FIGS. 5A to 5C, according to various embodiments, an antenna device 5300 included an electronic device 500 (e.g., the electronic device 100 shown in FIG. 1 or the electronic device 300 shown in FIG. 3) may include at least one or more wireless communication antenna 5102 and/or at least one or more wireless charging antenna 530 (or including a conductive pattern). For example, the electronic device 500 may include a second structure 510 that is a fixed part (e.g., the second structure 110 shown in FIG. 1), a first structure 520 that is a movable part (e.g., the first structure 120 shown in FIG. 1 or the first structure 320 shown in FIG. 3), and a flexible display 525 having a display region that expands when the first structure 520 is opened (slid up) (e.g., the flexible display 330 shown in FIG. 3). Flatness of the flexible display 525 can be maintained by a supporting member 526 (e.g., the supporting member 340 shown in FIG. 3), a wire (e.g., the wire 343 shown in FIG. 3), and a pair of rollers 527 (e.g., the rollers 342 shown in FIG. 3).

According to an embodiment, depending on the structure of the electronic device 500, some of at least one or more antenna devices 5300 may be disposed in the second structure 510 and the others may be disposed in the first structure 520, or all of them may be disposed in the second structure 510, or all of them may be disposed in the first structure 520. For example, at least one or more wireless charging antennas 530 may be disposed in the first structure 520 (e.g., the first structure 120 shown in FIG. 1 or the first structure 320 shown in FIG. 3) and at least one or more wireless communication antennas 5102 may be disposed in the second structure 510 (e.g., the housing 111 shown in FIG. 1). As another example, though not shown, at least one or more wireless charging antennas (e.g., the wireless charging antennas 530) may be disposed in the second structure 510 and at least one or more wireless communication antennas (e.g., wireless communication antennas 5102) may be disposed in the first structure 520. As another example, though not shown, at least one or more wireless charging antennas (e.g., the wireless charging antennas 530) and at least one or more wireless communication antennas (e.g., wireless communication antennas 5102) both may be disposed in the first structure 520. As another example, though not shown, at least one or more wireless charging antennas (e.g., the wireless charging antennas 530) and at least one or more wireless communication antennas (e.g., wireless communication antennas 5102) both may be disposed in the second structure 510.

According to various embodiments, the electronic device 500 may include a flexible display 525 having a display region that changes when the first structure 520 is moved (e.g., the flexible display 130 shown in FIG. 1 or the flexible display 330 shown in FIG. 3). The antenna device (e.g., the wireless communication antenna 5102 and the wireless charging antenna 530) may include at least one or more shielding material layers (e.g., a shielding material layer 1050 shown in FIG. 10A) to be spatially isolated from the flexible display 525.

According to various embodiments, the electronic device 500 may include a wireless charging antenna 530 disposed in the first structure 520 and a wireless communication antenna 5102 disposed in the second structure 510. According to various embodiments, the electronic device 500 may include a flexible circuit unit 532 connecting the wireless charging antenna 530 mounted in the first structure 520 and the wireless communication antenna 5102 disposed in the second structure 510. For example, the wireless charging antenna 530 may be at least a portion of a wireless charging module.

According to various embodiments, the electronic device 500 may include at least one or more flexible conductive paths electrically connecting the wireless charging antenna 530 (e.g., a conductive pattern) and the wireless communication antenna 5102. For example, the flexible circuit unit 532 may be a first flexible conductive path. The first flexible conductive path may extend between the wireless charging antenna 530 and the wireless communication antenna 5102 and electrically connect them. The stated conductive pattern may include the wireless charging antenna 530.

Flexible conductive paths according to various embodiments may be disposed between the printed circuit board 524 and the wireless charging antenna 530 (conductive pattern) and may electrically connecting them. For example, a flexible conductive path may be formed between the wireless charging circuit of the printed circuit board 524 and the wireless charging antenna 530, and a flexible conductive path may be formed between the wireless communication circuit of the printed circuit board 524 and the wireless charging antenna 530 (conductive pattern).

For example, the flexible conductive paths may be flexible printed circuit board, flexible cables, or rigid receptacles or connection terminals.

Figure 8A:
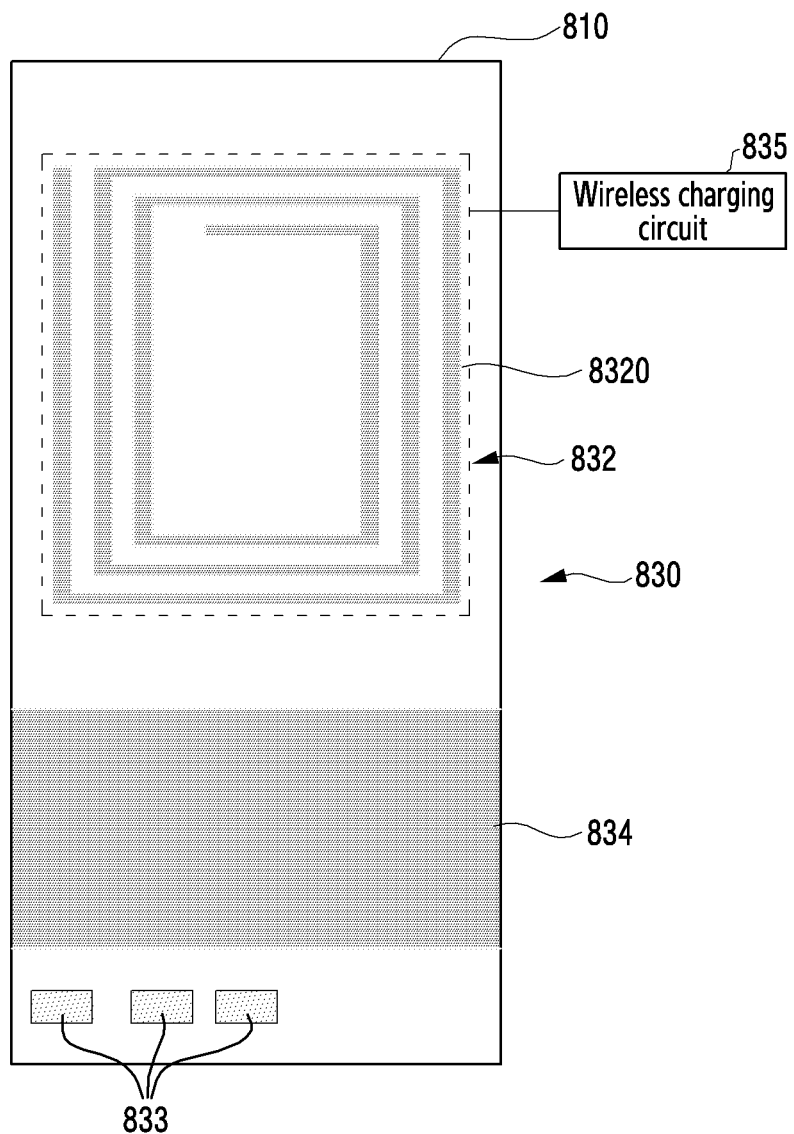
FIG. 8A is a plan view showing an antenna device according to various embodiments of the disclosure.
Figure 8B:
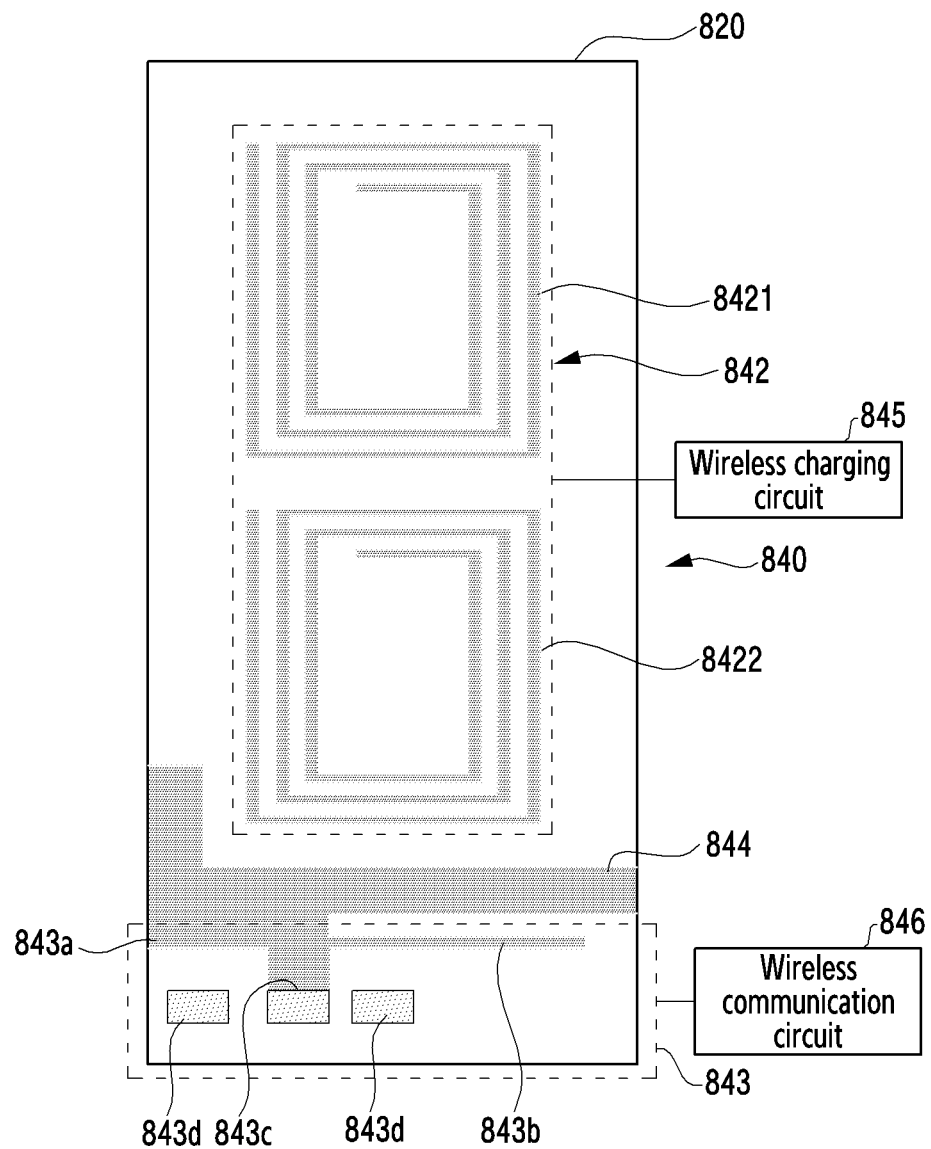
FIG. 8B is a plan view showing another antenna device according to various embodiments of the disclosure.

According to various embodiments, the wireless charging antenna 530 may include at least one or more coils (e.g., see FIGS. 8A and 8B). The coils may be formed in a flat shape, for example, a plate shape and may be disposed on the flexible circuit board. For example, the wireless charging antenna 530 may be disposed between a rear case 521 and a fixed portion 522 of the first structure.

The wireless charging antenna 530 according to various embodiments may be composed of some of a plurality of conductive patterns. The conductive patterns may be disposed on a second plate (e.g., the second plate 1100 shown in FIG. 1) and may be positioned between a first surface of a first plate (e.g., the first plate 1200 shown in FIG. 1) and the second plate (e.g., the second plate 1100 shown in FIG. 1).

According to various embodiments, the flexible circuit unit 532 bends at least one or more times, thereby being able to cope with a length change due to movement of the first structure 520. The flexible circuit unit 532 may be a connector that physically and electrically connects the wireless charging antenna 530 and the wireless communication antenna 5102.

According to various embodiments, the electronic device 500 include at least one or more wireless communication antennas 5102 disposed in the second structure 510, and the wireless communication antennas 5102 may be apportion of the second structure 510 at least partially made of a metal material. For example, the second structure 510 may include at least one or more metal frames, which may be outer frames corresponding to a portion of the outer shape of the second structure 510. For example, the outer metal frame may be formed in a folded type.

According to various embodiments, the wireless communication antenna 5102 may be electrically connected to an end of the flexible circuit unit 532 by an antenna connection terminal 534. As another example, the wireless communication antenna 5102 may be disposed between the rear case 521 and the internal fixed portion 522 of the first structure 520. For example, the internal fixed portion 522 may be an adhesive layer.

According to various embodiments, the second structure 510 may be made of a metal material or synthetic resin. For example, when the second structure 510 is made of a metal material, a back cover 5104 that may face close to the wireless charging antenna 530 may be made of a nonmetallic material. For example, the back cover 5104 may be made of any one of a glass material or a synthetic resin material.

According to various embodiments, when the first structure 520 is closed, the flexible circuit unit 532 may be bent at least one or more times and disposed between the second structure 510 and the supporting member 526. When the first structure 520 is open, the flexible circuit unit 532 may be partially unbent and disposed flat close to the second structure 510.

In the antenna device 5300 disposed in the electronic device 500 according to various embodiments, the wireless charging antenna 530 and the flexible circuit unit 532 may be integrated on one Flexible Printed Circuit Board (FPCB) 5302. At least one or more coils may be disposed on one FPCB 5302 of one wireless charging antenna 530. An end of the flexible circuit unit 532 may be physically and electrically connected to the wireless charging antenna 530 and another end thereof may be the connection terminal 534.

According to various embodiments, the wireless charging antenna 530 may include a receptacle 523, thereby being able to be physically and electrically connected to a main printed circuit board 524 disposed in the first structure. A wireless charging circuit (not shown) connected with the wireless charging antenna 530 and a wireless communication circuit unit (not shown) connected with the wireless communication antenna 5102 may be disposed on the main printed circuit board 524.

Figure 6A:
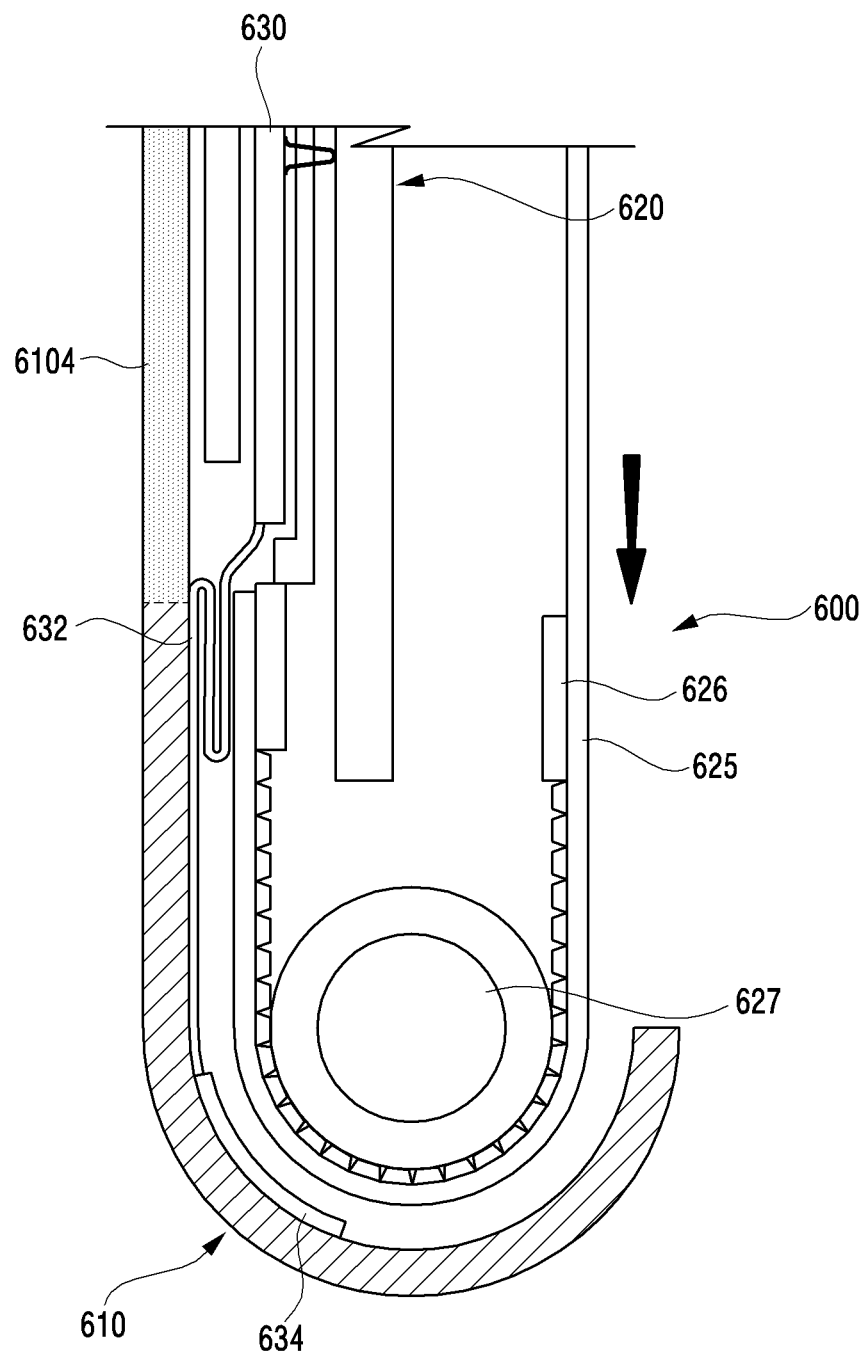
FIG. 6A is a cross-sectional view showing the structure around an antenna of an electronic device including an antenna device in a closed state in accordance with various embodiments of the disclosure.
Figure 6B:
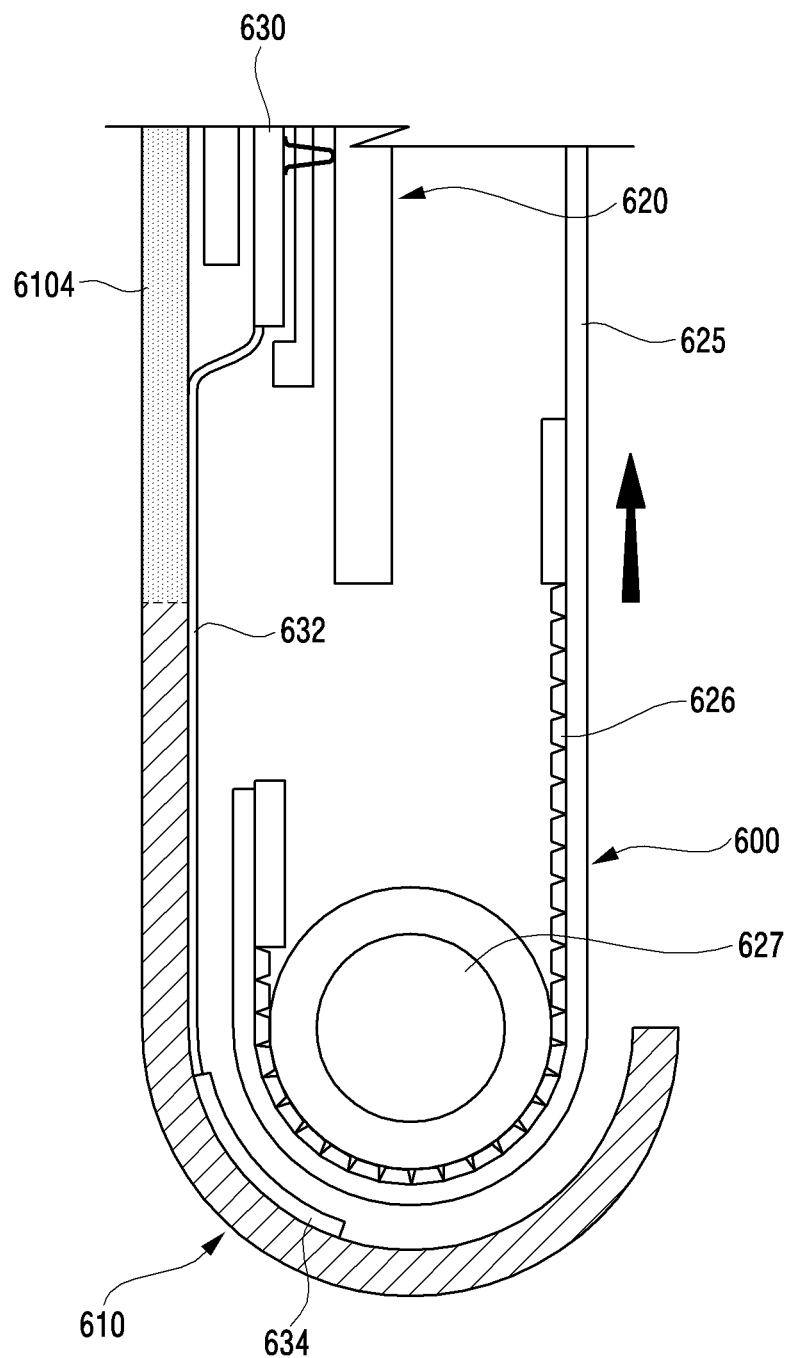
FIG. 6B is a cross-sectional view showing the structure around the antenna of the electronic device including an antenna device in an open state in accordance with various embodiments of the disclosure.
Figure 6C:
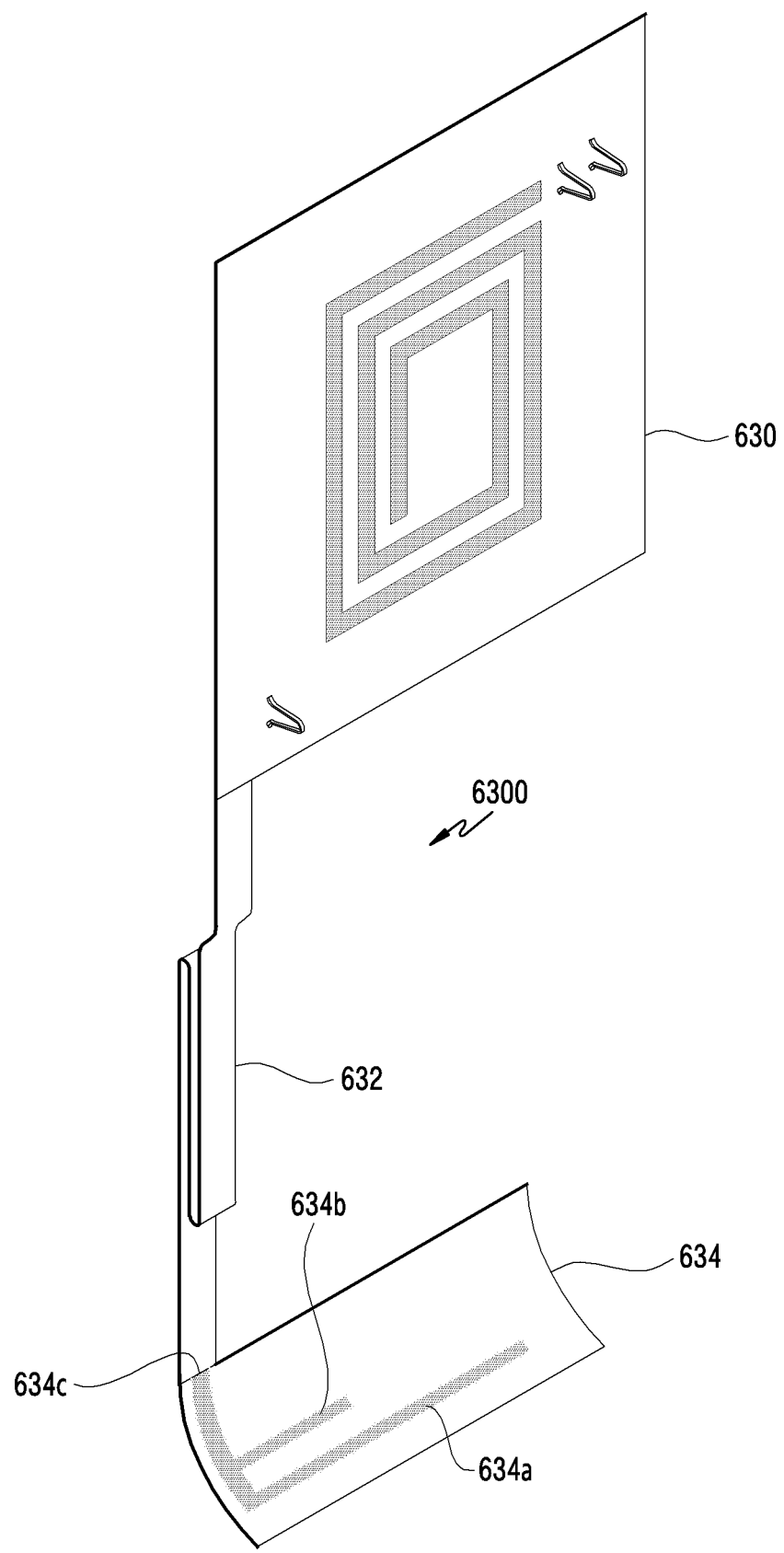
FIG. 6C is a perspective view showing an antenna device according to various embodiments of the disclosure.

FIG. 6A is a cross-sectional view showing the structure around an antenna of an electronic device including an antenna device in a closed state in accordance with various embodiments of the disclosure. FIG. 6B is a cross-sectional view showing the structure around the antenna of the electronic device having an antenna device in an open state in accordance with various embodiments of the disclosure. FIG. 6C is a perspective view showing an antenna device according to various embodiments of the disclosure.

Referring to FIGS. 6A to 6C, according to various embodiments, an antenna device 6300 included in an electronic device 600 (e.g., the electronic device 100 shown in FIG. 1, the electronic device 300 shown in FIG. 3, or the electronic device 500 shown in FIG. 5), as compared with the antenna device 5300 included in the electronic device 500 shown in FIGS. 5A to 5C, may be different only in the structure of the wireless communication antenna and may be the same or similar in other configuration.

The antenna device 6300 included in the electronic device 600 according to various embodiments may include at least one or more wireless communication antennas 634 and/or at least one or more wireless charging antennas 630 (e.g., the wireless charging antenna 530 shown in FIG. 5). For example, the electronic device 600 may include a second structure 610 (e.g., the second structure 110 shown in FIG. 1, the housing 310 shown in FIG. 3, or the second structure 510 shown in FIG. 5), a first structure 620 (e.g., the first structure 120 shown in FIG. 1, the first structure 320 shown in FIG. 3, or the first structure 520 shown in FIG. 5), and a flexible display 625 having a display region that changes when the first structure 620 is moved (e.g., the flexible display 130 shown in FIG. 1, the flexible display 330 shown in FIG. 3, or the flexible display 525 shown in FIG. 5). Flatness of the flexible display 625 can be maintained by a supporting member 626 (e.g., the supporting member 340 shown in FIG. 3), a wire (e.g., the wire 343 shown in FIG. 3), and a pair of rollers 627 (e.g., the rollers 342 shown in FIG. 3).

According to various embodiments, the electronic device 600 may include a wireless charging antenna 630 disposed in the first structure 620 and a wireless communication antenna 634 disposed in the second structure 610. According to various embodiments, the electronic device 600 may include a flexible circuit unit 632 connecting the wireless charging antenna 630 mounted in the first structure 620 and the wireless communication antenna 634 disposed in the second structure 610. For example, the flexible circuit unit 632 may include at least one or more transmission lines.

According to various embodiments, the electronic device 600 includes at least one or more wireless communication antennas 634 and the wireless communication antennas 634 may be flexible circuit boards 6302 having an antenna radiator pattern, or thin plates made of a metal material. The wireless communication antenna 634 may include a first antenna radiator 634a, a second antenna radiator 634b diverging from the first antenna radiator 634a, or an antenna power supplier 634c. The first and second antenna radiators 634a and 634b can be electrically connected with a wireless communication circuit through transmission lines in the wireless charging antenna 630 and the flexible circuit unit 632. The transmission lines may be connected to/supplied with power from the antenna power supplier 634c. The first and second antenna radiators 634a and 634b may be operated, for example, at different resonance frequencies.

According to various embodiments, in the antenna device 6300 included in the electronic device 600, the wireless charging antenna 630, the wireless communication antenna 634, and the flexible circuit unit 632 may be formed as one flexible circuit board 6302. As another example, in the antenna device 6300, the wireless communication antenna 634 may be connected to an end of the flexible circuit 632 through a separate connector (e.g., the connection terminal 534 shown in FIG. 5A).

According to various embodiments, the second structure 610 may be made of a metal material or synthetic resin. For example, when the second structure 610 is made of a metal material, a portion of a back cover 6104 that may be disposed close to the wireless charging antenna 630 may be made of, for example, a glass material or a synthetic resin material.

According to various embodiments, when the first structure 620 has been closed (slid down), the flexible circuit unit 632 may be bent at least one or more times and positioned between the second structure 610 and the flexible display 625. When the first structure 620 has been opened (slid up), the flexible circuit unit 632 may be unbent and disposed flat (in a plane shape).

Figure 7A:
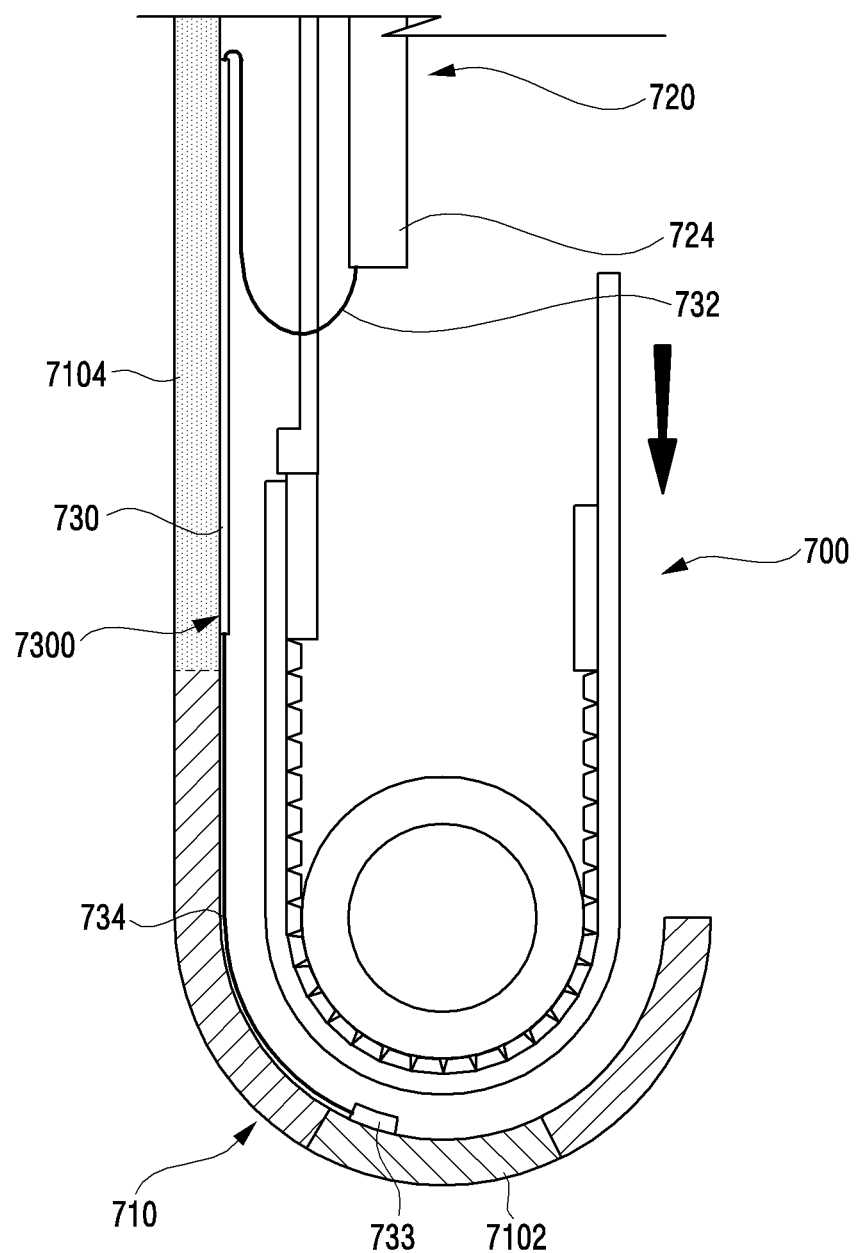
FIG. 7A is a cross-sectional view showing the structure around an antenna of an electronic device including an antenna device in a closed state in accordance with various embodiments of the disclosure.
Figure 7B:
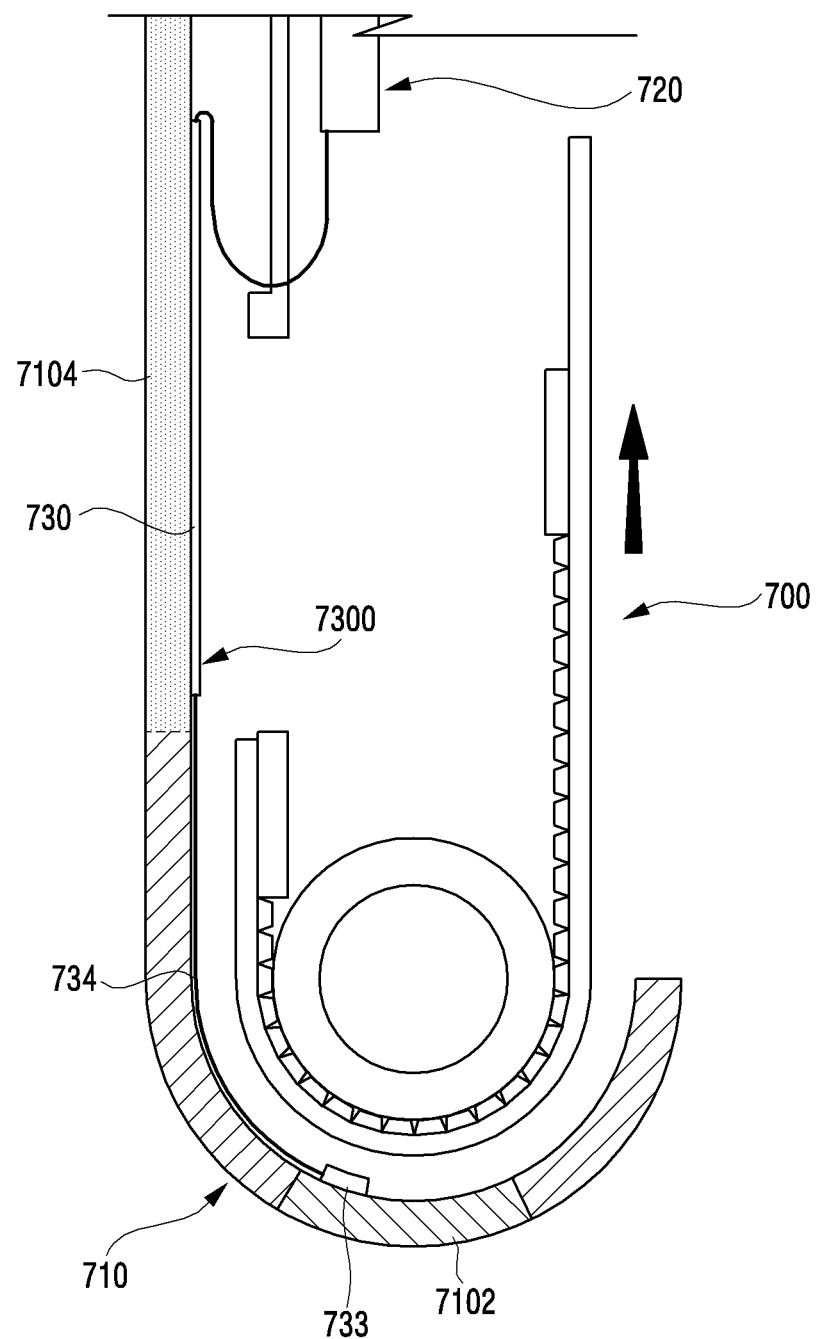
FIG. 7B is a cross-sectional view showing the structure around the antenna of the electronic device having an antenna device in an open state in accordance with various embodiments of the disclosure.

FIG. 7A is a cross-sectional view showing the structure around an antenna of an electronic device including an antenna device 7300 in a closed state in accordance with various embodiments of the disclosure. FIG. 7B is a cross-sectional view showing the structure around the antenna of the electronic device having the antenna device 7300 in an open state in accordance with various embodiments of the disclosure.

Referring to FIGS. 7A and 7B, according to various embodiments, an electronic device 700 may be an electronic device that is the same as or similar to the electronic devices shown in FIGS. 1 to 4. According to various embodiments, the electronic device 700, as compared with the electronic device 500 shown in FIGS. 5A to 5C, may be different only in the arrangement of the antenna device 7300 and may be the same or similar in other configuration.

According to various embodiments, the electronic device 700 may include at least one or more wireless charging antennas 730 (e.g., the wireless charging antenna 530 shown in FIG. 5) or at least one or more wireless communication antenna 7102 (e.g., the wireless communication antenna 5102 shown in FIG. 5A) disposed in a second structure 710 (e.g., the second structure 110 shown in FIG. 1, the second structure 310 shown in FIG. 3, or the second structure 510 shown in FIG. 5).

According to various embodiments, the electronic device 700 may include a flexible circuit unit 732 (e.g., the flexible circuit unit 532 shown in FIG. 5A or the flexible circuit unit 632 shown in FIG. 6A) physically and electrically connecting the wireless charging antenna 730 mounted in the second structure 710 (e.g., the wireless charging antenna 530 shown in FIG. 5A or the wireless charging antenna 630 shown in FIG. 6A) and the wireless communication antenna 7102 (e.g., the wireless communication antenna 5102 shown in FIG. 5A) to a main printed circuit board 724 (e.g., the printed circuit board 524 shown in FIG. 5A).

According to various embodiments, the electronic device 700 include at least one or more wireless communication antennas 7102, and for example, the wireless communication antenna 7102 may be metal frame included in the second structure 710 or an outer metal frame, but is not limited thereto, and may be a flexible circuit board having an antenna radiator pattern or a thin plate made of a metal material in the second structure 710. For example, the wireless communication antenna 7102 may be formed on one flexible circuit board (e.g., the flexible circuit board 5302 shown in FIG. 5C, the flexible circuit board 6302 shown in FIG. 6C, a flexible circuit board 810 shown in FIG. 8A, or a flexible circuit board 820 shown in FIG. 8B) together with the wireless charging antenna 730, and additionally, a portion of the second structure 710 is made as a metal frame, whereby it can be used as an antenna radiator.

According to various embodiments, it is possible to electrically connect a second flexible circuit unit 734 and the wireless communication antenna 7102 using a connection terminal 733 (e.g., the connection terminal 534 shown in FIG. 5A). For example, the wireless communication antenna 7102 is exposed out of the second structure 710 and forms a portion of the external shape, so it may be referred to as an outer metal frame. Though not shown in the figures, the outer metal frame may be formed in a folded type, so it can operate as a radiator in a specific band. The wireless communication antenna 7102, for example, may extend in the transverse direction of the second structure 710. As another example, the second flexible circuit unit 734 has a radiator pattern (not shown), so it can be used as a wireless communication antenna in another band.

According to various embodiments, the second structure 710 may be made of a metal material or synthetic resin. For example, when the second structure 710 is made of a metal material, a portion of a back cover 7104 that may face close to the wireless charging antenna 730 may be made of, for example, any one of a glass material or a synthetic resin material.

According to various embodiments, in the electronic device 700, the wireless charging antenna 730 may be physically and electrically connected to the main printed circuit board 724 disposed in the first structure 720 by the first flexible circuit unit 732. For example, the first flexible circuit unit 732 is bent at least one or more times, so it can cope with movement of the first structure 720.

FIG. 8A is a plan view showing an antenna device according to various embodiments of the disclosure.

Referring to FIG. 8A, according to various embodiments, an antenna device 830 may have a structure that is the same as or similar to that of the wireless charging antenna 530 shown in FIGS. 5A to 5C, the wireless charging antenna 630 shown in FIGS. 6A to 6C, or the wireless charging antenna 730 shown in FIGS. 7A and 7B.

According to various embodiments, the antenna device 830 may include a wireless charging antenna 832 (e.g., the wireless charging antenna 530 shown in FIG. 5A or the wireless charging antenna 630 shown in FIG. 6C), a wireless communication antenna (not shown), and a ground 834 that are disposed on one flexible circuit board 810. For example, the wireless charging antenna 832 may include a coil 8320 disposed in any one of a substantially circular, elliptical, rectangular, or spiral shape. The ground 834 may be formed by disposing a conductive line, a conductive pattern, or a metallic thin film on the flexible circuit board 810. The conductive portion formed on the flexible circuit board 810 can serve as an antenna radiator, and the band operation frequency may be adjusted, depending on a change in shape. When the antenna device 830 is disposed in the first structure (e.g., the first structure 520 shown in FIG. 5A) of the electronic device, a flexible circuit unit (e.g., the flexible circuit unit 532 shown in FIG. 5A) that compensates for the length according to sliding-up or sliding-down is not shown. The antenna device 830 may have a connection terminal 833.

Both ends of the coil 8320 according to various embodiments may be electrically connected to the wireless charging circuit 835.

FIG. 8B is a plan view showing another antenna device according to various embodiments of the disclosure.

Referring to FIG. 8B, according to various embodiments, an antenna device 840 may have a structure that is the same as or similar to that of the wireless charging antenna 530 shown in FIGS. 5A to 5C, the wireless charging antenna 630 shown in FIGS. 6A to 6C, or the wireless charging antenna 730 shown in FIGS. 7A and 7B.

According to various embodiments, the antenna device 840 may include a wireless charging antenna 842 (e.g., the wireless charging antenna 832 shown in FIG. 8A), a ground 844 (e.g., the ground 834 shown in FIG. 8A), and a wireless communication antenna 834 that are disposed on one flexible circuit board 820 (e.g., the flexible circuit board 810 shown in FIG. 8A). For example, the wireless charging antenna 842 may include first and second coils 8421 and 8422. For example, the wireless charging antenna 842 may be formed in any one of a substantially circular, elliptical, rectangular, or spiral shape. The first and second coils 8421 and 8422, for example, may be disposed in parallel without overlapping on the flexible circuit board 820. As another example, the shapes or thicknesses of the first and second coils 8421 and 8422 may be the same as or different from each other.

According to various embodiments, the wireless charging antenna 843 may be formed by disposing a conductive line, a conductive pattern, or a metallic thin film on the flexible circuit board 820. The conductive portion formed on the flexible circuit board 820 can at least partially serve as an antenna radiator, and the band operation frequency may be adjusted, depending on a change in shape. According to various embodiments, the wireless communication antenna 843 may include a first antenna radiator 843a, a second antenna radiator 843*b*, a connection terminal 843*d*, and a power supplier 843*c*. For example, the first and second antenna radiators 843*a* and 843*b* may be electrically connected to another wireless communication antenna having a metal frame structure by the connection terminal 843*d*. For example, the connection terminal 843*d* may be configured as a power supplier for the antenna radiators by being connected to an antenna formed by a metal frame of a housing. The power supplier 843*c* is configured as a grounding part by being connected with the metal frame of the housing, whereby a ground can be formed.

Both ends of the first and second coils 8421 and 8422 according to various embodiments may be electrically connected to a wireless charging circuit 845. The wireless communication antenna 843 according to various embodiments may be electrically connected to a wireless communication circuit 846. The wireless charging circuit 845 and the wireless communication circuit 846 may be disposed on a printed circuit board (e.g., the printed circuit board 524 shown in FIG. 5A).

Figure 9A:
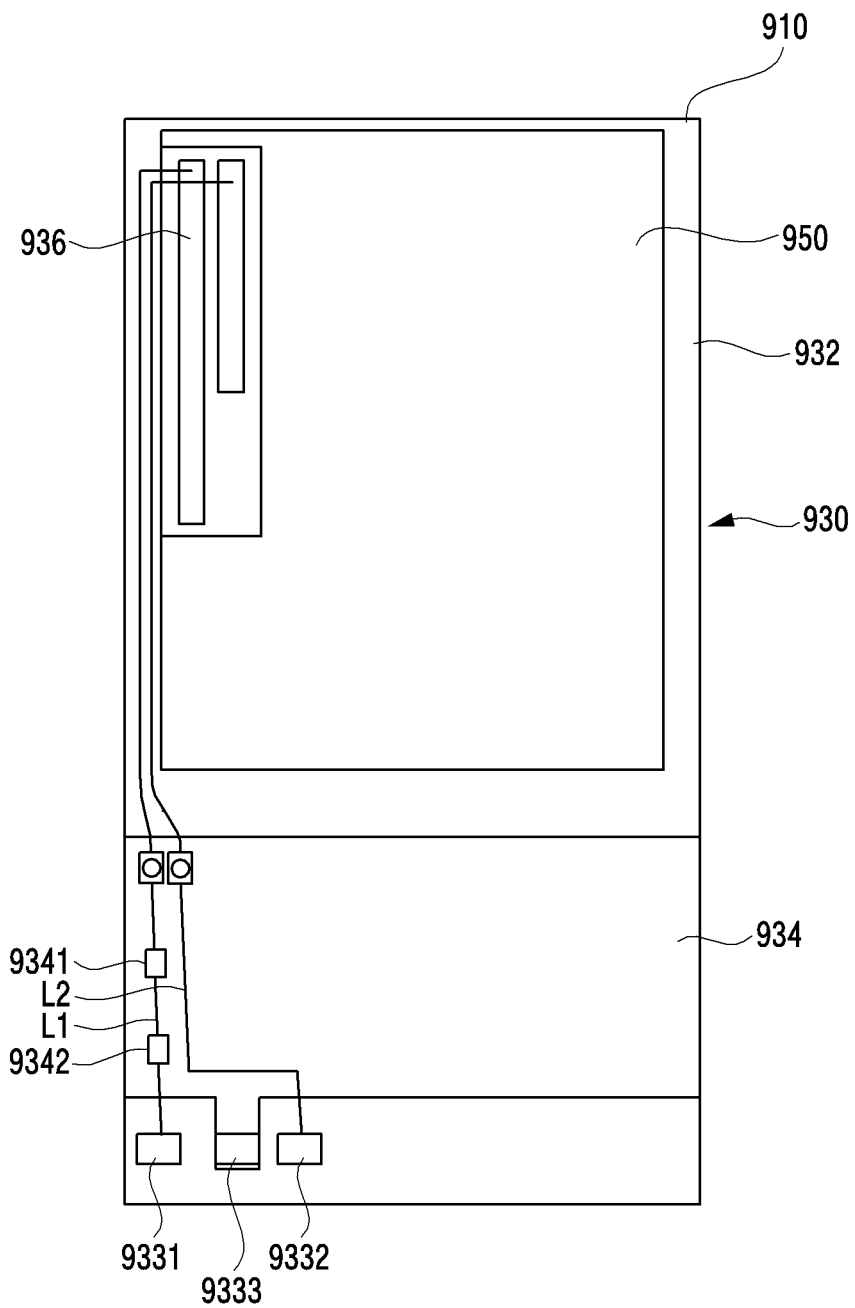
FIG. 9A is a plan view showing an antenna device including a shielding material layer according to various embodiments of the disclosure.

FIG. 9A is a plan view showing an antenna device including a shielding material layer according to various embodiments of the disclosure.

Referring to FIG. 9A, according to various embodiments, an antenna device 930 may be included substantially as the same configuration in the electronic devices shown in FIGS. 1 to 4 (e.g., the electronic device 100 or the electronic device 300).

According to various embodiments, the antenna device 930 may include a wireless charging antenna 932 (e.g., the wireless charging antenna 832 shown in FIG. 8A or the wireless charging antenna 842 shown in FIG. 8B) and a ground 934 (e.g., the ground 834 shown in FIG. 8A) that are disposed on one flexible circuit board 910 (e.g., the flexible circuit board 810 shown in FIG. 8A). For example, the wireless charging antenna 932 may include a coil (e.g., the coil 8320 shown in FIG. 8A) disposed in a circular, elliptical, rectangular, or spiral shape. The ground 934 may be formed by disposing a conductive line, a conductive pattern, or a metallic thin film on the flexible circuit board 910. The antenna device 930 has first and second connection terminal power suppliers 9331 and 9332, so it can be connected to supply power to a wireless communication antenna such as metal frame (e.g., the wireless communication antenna 7102 shown in FIG. 7A). The ground 934 may be connected to a grounding part 9333.

According to various embodiments, the antenna device 930 may include a configuration connected to first antenna radiator through a first power supply line L1 and matching circuits 9341 and 9342 or a first power supplier 9331 to transmit/receive an RF signal to/from the first antenna radiator (not shown) (e.g., the first antenna radiator 843*a* shown in FIG. 8B) and a second antenna radiator (not shown) (e.g., the second antenna radiator 843*b* shown in FIG. 8B) through a wireless communication circuit (e.g., the wireless communication circuit 846 shown in FIG. 8B). As another example, the antenna device 930 according to various embodiments may be connected to a matching circuit (not shown) through a second power supply line L2 and may include a configuration connected to the second antenna radiator through a second power supplier 9332. For example, the first antenna radiator or the second antenna radiator may be a portion of a metal housing (e.g., the housing 111 shown in FIG. 1). For example, the matching circuits 9341 and 9342 may include R, L, and C lumped elements.

According to various embodiments, in an electronic device (e.g., the electronic device 100), when the regions in which the antenna device 930 and a flexible display (e.g., the flexible display 130 shown in FIG. 1, the flexible display 330 shown in FIG. 3, or the flexible display 525 shown in FIG. 5A) exist are very close (see FIGS. 3 and 4), radio waves and energy radiated from the antenna device 930 may sufficiently act as noise to the flexible display. As another example, electromagnetic waves emitted from the flexible display may act as noise to an RF signal. In order to prevent generation of such different noises, according to various embodiments, the antenna device 930 may further include a shielding material layer 950 on the flexible circuit board 910. The shielding material layer 950 may be attached to the wireless charging antenna 932. For example, the wireless charging antenna 932 and the shielding material layer 950 may be disposed to overlap each other. The shielding material layer 950 can electrically isolate the wireless charging antenna 932 and a bendable portion (e.g., a display expansion region) of the flexible display (e.g., the bendable portion 134 shown in FIG. 2) from each other.

According to various embodiments, the shielding material layer 950 may be made of a ferrite material and may be attached to the antenna device 930 in the type of a tape. When the shielding material layer 950 is disposed between the flexible display and the antenna 930, RF signal interference therebetween can be reduced. The shielding material layer 950 can serve to refract magnetic flux to the outside without allowing the magnetic flux to permeate into the electronic device. A flexible circuit unit 936 can electrically connect the antenna device 930 and a main printed circuit board (e.g., the main printed circuit board 624 shown in FIG. 6) included in a first structure (e.g., the first structure 620 shown in FIG. 6).

Figure 9B:
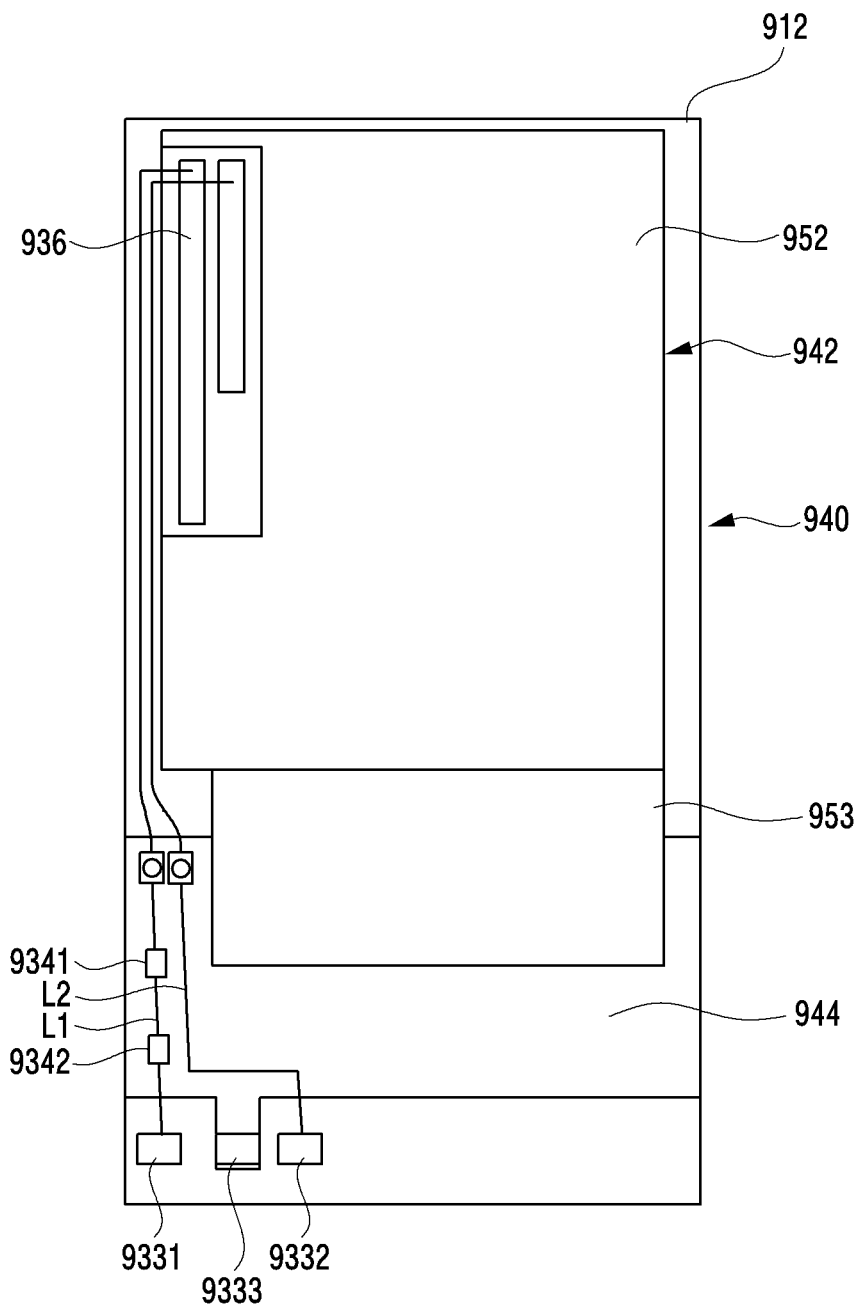
FIG. 9B is a plan view showing another antenna device including a shielding material layer according to various embodiments of the disclosure.

FIG. 9B is a plan view showing another antenna device including a shielding material layer according to various embodiments of the disclosure.

Referring to FIG. 9B, according to various embodiments, an antenna device 940 may be included substantially as the same configuration in the electronic devices shown in FIGS. 1 to 4 (e.g., the electronic device 100 or the electronic device 300). In the description of the antenna device 940 shown in FIG. 9B, the same configuration as the antenna device 930 shown in FIG. 9A is not described and the differences are mainly described.

According to various embodiments, the antenna device 940 may include a wireless charging antenna 942 (e.g., the wireless charging antenna 832 shown in FIG. 8A, the wireless charging antenna 842 shown in FIG. 8B, or the wireless charging antenna 932 shown in FIG. 9A) and a ground 944 (e.g., the ground 834 shown in FIG. 8A, the ground 844 shown in FIG. 8B, or the ground 934 shown in FIG. 9A) that are disposed on one flexible circuit board 912 (e.g., the flexible circuit board 810 shown in FIG. 8A, the flexible circuit board 820 shown in FIG. 8B, or the flexible circuit board 910 shown in FIG. 9A). For example, the wireless charging antenna 942 may include spirally disposed first and second coils (e.g., the first and second coils 8412 and 8422 shown in FIG. 8B). The ground 944 may be formed by disposing a conductive line, a conductive pattern, or a metallic thin film on the flexible circuit board 912.

According to various embodiments, in an electronic device, since the regions in which the antenna device 940 and a flexible display (e.g., the flexible display 130 shown in FIG. 1, the flexible display 330 shown in FIG. 3, or the flexible display 525 shown in FIG. 5A) exist are very close (e.g., see FIGS. 3 and 4), radio waves and energy radiated from the antenna device 940 may sufficiently act as noise to the flexible display (e.g., the flexible display 130 shown in FIG. 1). On the other hand, electromagnetic waves emitted from the flexible display may act as noise to an RF signal.

In order to prevent generation of such different noises, according to various embodiments, the antenna device 940 may further include first and second shielding material layers 952 and 953 on the flexible circuit board 912. The first and second shielding material layers 952 and 953 may be attached with areas enough to cover first and second coils (e.g., the first and second coils 8421 and 8422 shown in FIG. 8B) of the wireless charging antenna 940. The wireless charging antenna 942 formed by the first and second coils and the first and second shielding material layers 952 and 953 may be disposed to overlap each other. The first and second shielding material layers 952 and 953 can electrically isolate the wireless communication antenna 940 and a bendable portion (e.g., a display expansion region) of the flexible display (e.g., the bendable portion 134 shown in FIG. 2) from each other.

According to various embodiments, the materials of the first and second shielding material layers 952 and 953 are ferrite materials and may be attached to the flexible circuit board in the type of a tape. Since the antenna device 940 includes the first and second shielding material layers 952 and 953, RF signal interference between the antenna devices 940 can be reduced.

Figure 9C:
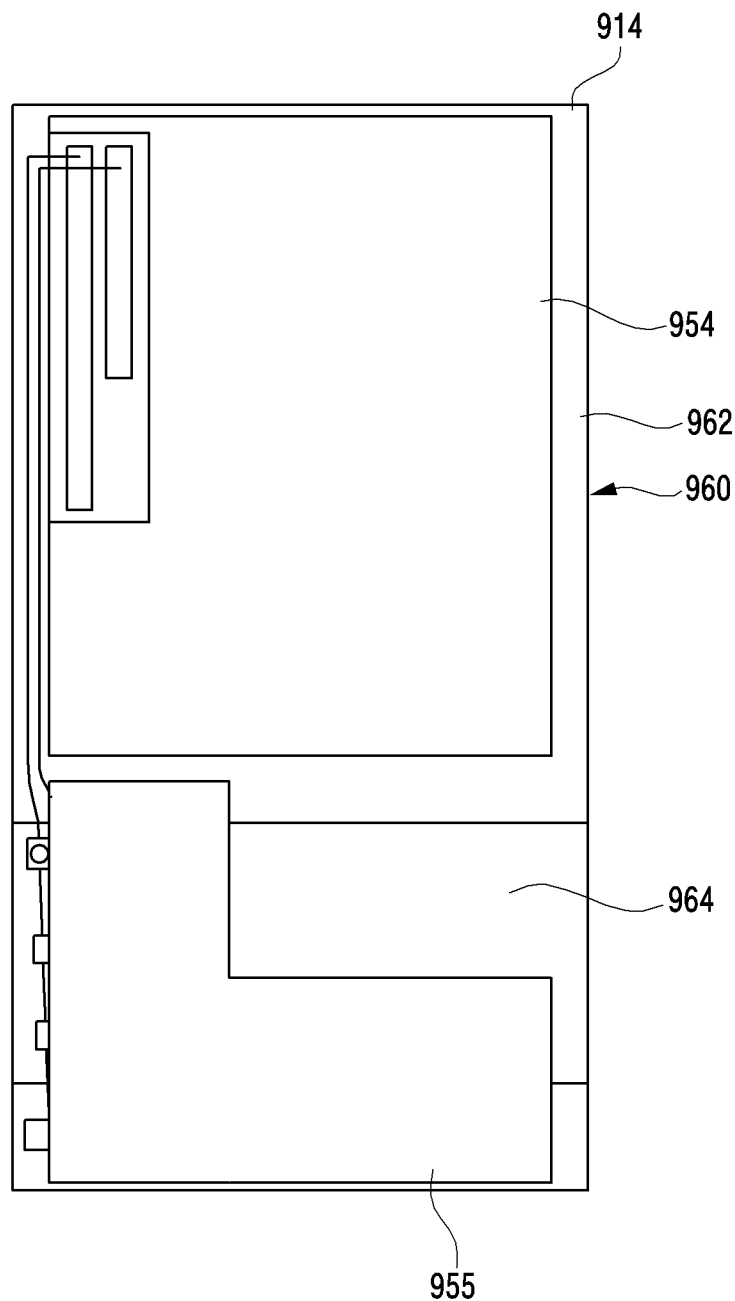
FIG. 9C is a plan view showing another antenna device including a shielding material layer according to various embodiments of the disclosure.

FIG. 9C is a plan view showing another antenna device including a shielding material layer according to various embodiments.

Referring to FIG. 9C, according to various embodiments, an antenna device 960 may be included substantially as the same configuration in the electronic devices shown in FIGS. 1 to 4 (e.g., the electronic device 100 or the electronic device 300). In the description of the antenna device 960 shown in FIG. 9C, substantially the same configuration as the antenna device 930 shown in FIG. 9A is not described and the differences are mainly described.

According to an embodiment, the antenna device 960 of an electronic device may further include first and second shielding material layers 954 and 955 (e.g., the shielding material layer 950 shown in FIG. 9A or the shielding material layer 952 shown in FIG. 9B) on a flexible circuit board 914 (e.g., the flexible circuit board 810 shown in FIG. 8*a*, the flexible circuit board 820 shown in FIG. 8B, the flexible circuit board 910 shown in FIG. 9A, or the flexible circuit board 912 shown in FIG. 9B). The first and second shielding material layers 954 and 955 may be attached with an area enough to cover a coil (e.g., the first and second coils 8421 and 8422 shown in FIG. 8B) of a wireless charging antenna 962 (e.g., the wireless charging antenna 832 shown in FIG. 8A, the wireless charging antenna 842 shown in FIG. 8B, the wireless charging antenna 932 shown in FIG. 9A, or the wireless charging antenna 942 shown in FIG. 9B) and a ground 964 (e.g., the ground 834 shown in FIG. 8A, the ground 934 shown in FIG. 9A, or the ground 944 shown in FIG. 9B). The wireless charging antenna 962 formed by a coil and the first shielding material layer 954 may be disposed to overlap each other, and the ground 964 and the second shielding material layer 955 may be disposed to overlap each other. The first and second shielding material layers 954 and 955 can electrically isolate the antenna device 960 and a bendable portion (e.g., a display expansion region) of the flexible display (e.g., the bendable portion 134 shown in FIG. 2) from each other.

For example, the materials of the first and second shielding material layers 954 and 955 are ferrite materials and may be attached to the flexible circuit board 914 in the type of a tape. The first and second shielding material layers 954 and 955 are disposed between the flexible display (e.g., the first flexible display 130 shown in FIG. 1) and the antenna 960, so RF signal interference therebetween can be reduced.

Figure 10A:
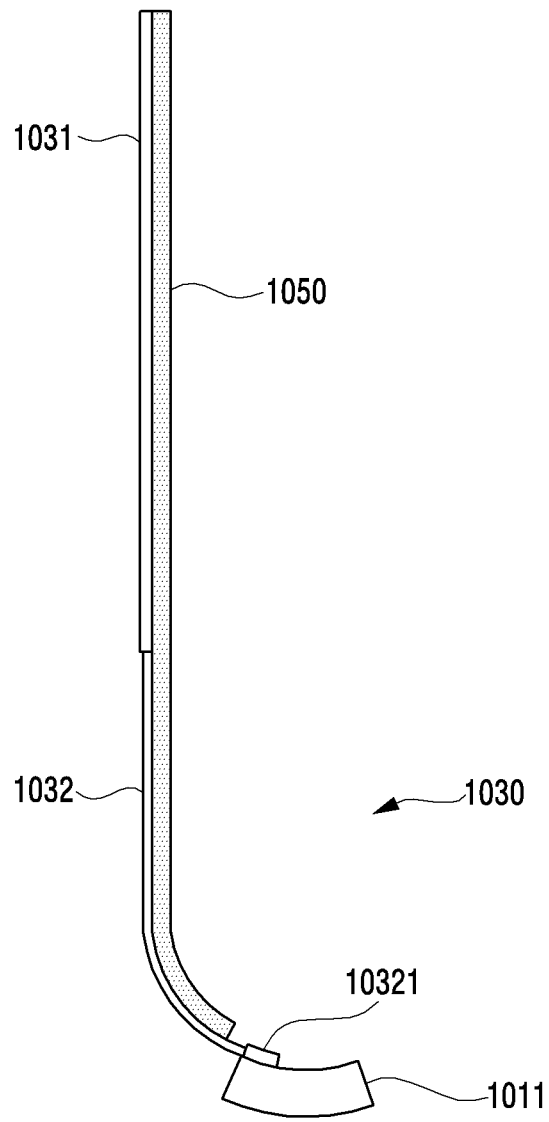
FIG. 10A is a cross-sectional view showing the configuration of an antenna device including a shielding material layer according to various embodiments of the disclosure.

FIG. 10A is a cross-sectional view showing the configuration of an antenna device 1030 including a shielding material layer according to various embodiments.

Referring to FIG. 10A, according to various embodiments, an antenna device 1030 included in an electronic device (e.g., the electronic device 100 shown in FIG. 1 or the electronic device 300 shown in FIG. 3) may include: a wireless charging and first wireless communication antenna 1031 disposed on one flexible circuit board (e.g., the flexible circuit board 810 shown in FIG. 8A, the flexible circuit board 820 shown in FIG. 8B, the flexible circuit board 910 shown in FIG. 9A, or the flexible circuit board 912 shown in FIG. 9B); a second wireless communication antenna 1011 formed by a metal frame included in at least a portion of a housing (the housing 111 shown in FIG. 1 or the housing 311 shown in FIG. 3); a connector 1032 electrically connecting the wireless charging and first wireless communication antenna 1031 and the second wireless communication antenna 1011; or a shielding material layer 1050 (e.g., the shielding material layer 950 shown in FIG. 9A or the shielding material layer 952 shown in FIG. 9B) covering the wireless charging and first wireless communication antenna 1031 and the connector 1032 (e.g., the flexible circuit unit 734 shown in FIG. 7A).

According to an embodiment, the second coil 8422 shown in FIG. 8B may be integrally formed in the same or at least similar structure in a wireless communication antenna of the wireless charging and first wireless communication antenna 1031. The second wireless communication antenna 1011 may be connected to a second antenna radiator (not shown) through a connector/power supplier. A connection terminal 10321 can connect the connector 1032 to the second wireless communication antenna 1011.

According to various embodiments, the second wireless communication antenna 1011 may be at least a portion of a metal housing (e.g., the conductive portion formed at the side member 100*a* shown in FIG. 1) of an electronic device. The connection terminal 10321 (e.g., the connection terminal 733 shown in FIG. 7A) is formed at an end of the connector 1032, so the wireless charging and first wireless communication antenna 1031 can be electrically connected to the second wireless communication antenna 1011.

According to various embodiments, the antenna device 1030 may include a shielding material layer 1050 having an area that can cover the wireless charging and first wireless communication antenna 1031 and the connector 1032.

Figure 10B:
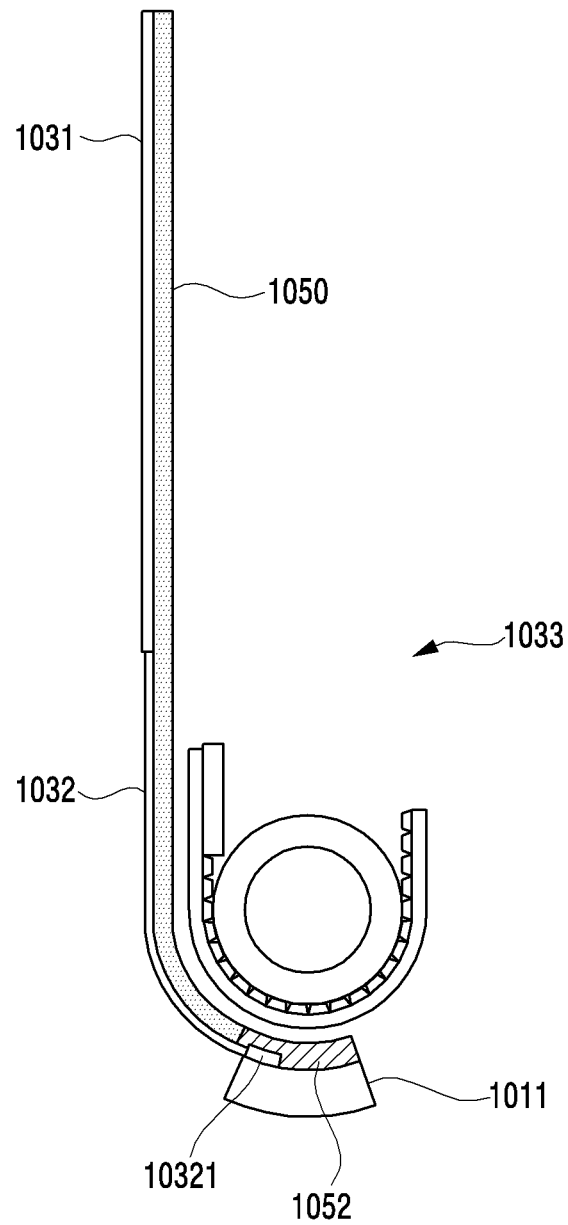
FIG. 10B is a cross-sectional view showing the configuration of an antenna device including another shielding material layer according to various embodiments of the disclosure.

FIG. 10B is a cross-sectional view showing the configuration of an antenna device including another shielding material layer according to various embodiments.

Referring to FIG. 10B, according to various embodiments, only the different of an antenna device 1033 from the antenna device 1030 shown in FIG. 10A is described. According to various embodiments, the antenna device 1033 may additionally include an assistant shielding material layer 1052 on the inner surface of the second wireless communication antenna 1011 (e.g., the conductive portion of the side wall 110*a* shown in FIG. 1A, the wireless communication antenna 5012 shown in FIG. 5A, or the wireless communication antenna 7102 shown in FIG. 7A). For example, the assistant shielding material layer 1052 may be attached to a surface of the second wireless communication antenna 1011 formed as at least a portion of a metal housing. The assistant shielding material layer 1052 may have an area enough to cover a surface of the second wireless communication antenna 1011. For example, the shielding material layer 1050 may have an area that can cover the wireless charging and first wireless communication antenna 1031 and the connector 1032. The assistant shielding material layer 1052 may have an area that can cover the second wireless communication antenna 1011 and the connection terminal 10321. The shielding material layer 1050 or the assistant shielding material layer 1052 may have the same or different thicknesses.

Figure 10C:
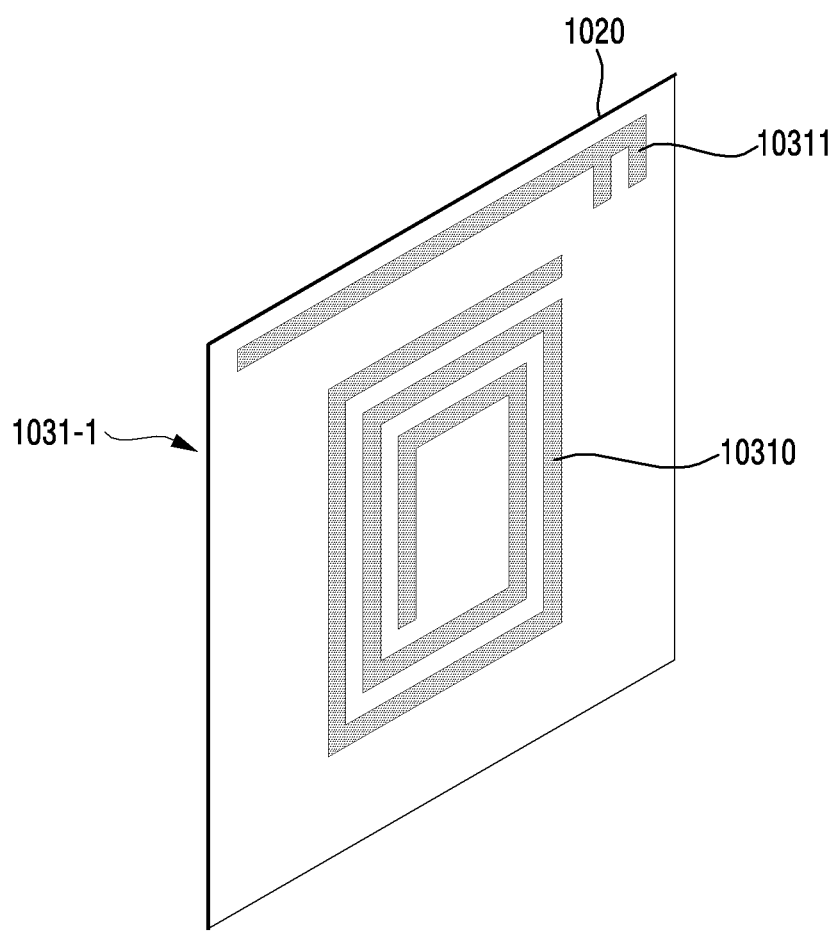
FIG. 10C is a perspective view showing a wireless charging and wireless communication antenna according to various embodiments of the disclosure.

Referring to FIG. 10C, a wireless charging and wireless communication antenna 1031-1 according to various embodiments (e.g., the wireless charging and first wireless communication antenna 1031 shown in FIG. 10A) may include at least one or more coils 10310 (e.g., the coil 8320 shown in FIG. 8A) disposed on one Flexible Printed Circuit Board (FPCB) 1020, and at least one or more antenna radiators 10311 (e.g., the antenna radiators 843a and 843b shown in FIG. 8A). For example, the coil 10310 and the antenna radiator 10311 may be disposed in parallel on the flexible printed circuit board 1020 without overlapping each other. The coil 10310 may be disposed at the center area of the flexible printed circuit board 1020, and the antenna radiator 10311 may be disposed in the edge area of the flexible printed circuit board 1020, for example, around the coil 10310.

Figure 10D:
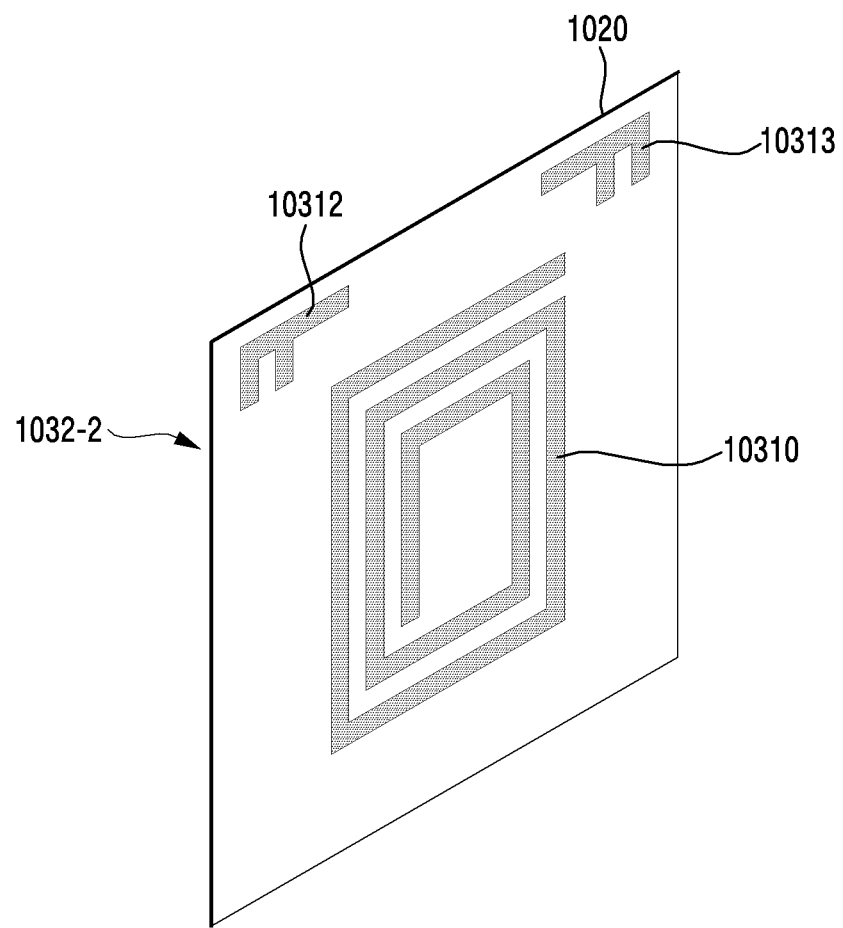
FIG. 10D is a perspective view showing another wireless charging and wireless communication antenna according to various embodiments of the disclosure.

Referring to FIG. 10D, a wireless charging and wireless communication antenna 1031-2 according to various embodiments (e.g., the wireless charging and first wireless communication antenna 1031 shown in FIG. 10A) may include at least one or more coils 10310 (e.g., the coil 8320 shown in FIG. 8A) disposed on one flexible printed circuit board 1020, and first and second antenna radiators 10312 and 10313 (e.g., the antenna radiators 843a and 843b shown in FIG. 8A). For example, the coil 10310 and the first and second antenna radiators 10312 and 10313 may be disposed in parallel on the flexible printed circuit board 1020 without overlapping each other. The coil 10310 may be disposed at the center area of the flexible printed circuit board 1020, and the first and second antenna radiators 10312 and 10313 may be disposed at the edge of the flexible printed circuit board 1020, for example, around the coil 10310.

According to various embodiments of the disclosure, an electronic device 100 may include: a first structure 120 including a first plate 1200 having a first surface and a second surface opposite the first surface; a second structure 110 including a second plate 1100 facing the second surface of the first plate 1200, a first side wall 110a perpendicular to the second plate 1100, a second side wall 110b perpendicular to the first side wall 110a and the second plate 1100, and a third side wall 110c perpendicular to the first side wall 110a and the second plate 1100 and parallel with the second side wall 110b in which the first side wall 110a has a conductive portion, and the second plate 1100, the first side wall 110a, the second side wall 110b, and the third side wall 110c form a trough 310d having an open side to accommodate at least a portion of the first structure 120, the first structure 120 can move between an open state and a closed state with respect to the second structure 110 in a first direction parallel with the second plate 1100 and the second side wall 110b, and the second structure 110 is positioned at a first distance from the first side wall 110a when the first structure 120 is in the closed state, and is positioned at a second distance larger than the first distance from the first side wall 110a in the open state; a display layer 130 being a flexible display touch screen layer, having a flat portion 132 extending across at least a portion of the first surface and mounted on the first surface and a bendable portion 134 extending in a space between the first side wall 110a and the first structure 120 from the flat portion 132 in the closed state in which when the first structure 120 is moved into the open state from the closed state, at least a portion of the bendable portion 134 forms a substantially flat surface between the flat portion 132 and the first side wall 110a when seen from above the first plate 1200; a conductive pattern 530 mounted on the second plate 1100 between the second surface and the second plate 1100; a first conductive path 532 extending between the conductive portion of the first side wall 110a and the conductive pattern 530; a printed circuit board 524 mounted in the first structure 120; a wireless charging circuit 845 mounted on the printed circuit board 524; a wireless communication circuit 846 mounted on the printed circuit board 524; and flexible conductive paths 523 and 532 connected between the printed circuit board 524 and the conductive pattern 530 and including a second conductive path 523 electrically connected between the wireless charging circuit 845 and the conductive pattern 530 and a third conductive path 523 electrically connected between the communication circuit 846 and the first conductive path 532.

According to various embodiments of the disclosure, the electronic device may further include a cable including the flexible conductive path 532.

According to various embodiments of the disclosure, the electronic device may further include a flexible printed circuit board including at least a portion of the flexible conductive path 532.

According to various embodiments of the disclosure, the flexible conductive path 532 can be moved between the open state and the closed state, and the flexible conductive path 532 can be bent at different angles between the open state and the closed state.

According to various embodiments of the disclosure, the conductive pattern 530 may include a wireless charging antenna and/or a wireless communication antenna.

According to various embodiments of the disclosure, the conductive portion (a portion of the side member 110a) may include an outer metal frame 5102 operating as an antenna radiator.

According to various embodiments of the disclosure, the conductive pattern 530 may further include a first shielding material layer 950, and the conductive portion (a portion of the side member 110a) may further include a second shielding material layer 1052.

According to various embodiments of the disclosure, an electronic device may include a housing 111 having a first cover 115 disposed in a first direction, a second cover 116 disposed in a second direction opposite to the first direction, and a plurality of side walls 110a~110c surrounding at least a portion of a space between the first and second covers 115 and 116; a first structure 120 disposed in at least a portion of the first plate 1100 of the housing to slide up/down; a flexible display 130 mounted in the first structure 120 to be at least partially exposed, having a display region expanding when the first structure 120 is slid up, and having a bendable portion 134 that is hidden into the housing when the first structure 120 is slid down; a wireless charging antenna 530 including at least one or more coils 8320 disposed in the first structure 120; at least one or more wireless communication antenna 5102 disposed in the housing 111; and a flexible circuit unit 532 bent at least one or more times, operating in correspondence to sliding-up or sliding-down of the first structure 120, and connecting the wireless charging antenna 530 and the communication antenna 5102.

According to various embodiments of the disclosure, the wireless charging antenna 530, the wireless communication antenna 5102, and the flexible circuit unit 532 each may be configured on one flexible circuit board.

According to various embodiments of the disclosure, the wireless charging antenna 530 and the flexible circuit unit 532 each may be included in one flexible circuit board.

According to various embodiments of the disclosure, the wireless charging antenna 530 may be disposed between a back cover 522 and a rear case 521 of the first structure 120.

According to various embodiments of the disclosure, a region, which faces the wireless charging antenna 530, of the housing 111 may be made of a nonmetallic material 5104.

According to various embodiments of the disclosure, the electronic device may include a supporting member 340 having a flexible display 530 positioned in close contact with a rear surface thereof, supporting the bendable portion 134 as a prop when the first structure 120 is protruded, and inserted into the housing 111 together with the bendable portion 134 when the first structure 120 is retracted.

According to various embodiments of the disclosure, the wireless communication antenna 5102 may be disposed to face and to be spaced apart from the flexible display 525 and the supporting member 526.

According to various embodiments of the disclosure, when the first structure 120 has been slid down, the flexible circuit unit 532 may be positioned between the housing 111 and the supporting member 340.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. The "module" may be mechanically or electronically implemented. For example, the "module" may include at least one of an application-specific integrated circuit (ASIC) chip, field-programmable gate arrays (FPGAs), and a programmable logic device for performing known operations or operations to be developed in the future.

Devices (e.g., modules or functions thereof) or methods (e.g., operations) according to various embodiments may be at least partially implemented as instructions that are stored in the form of a program module in a computer-readable storage medium. The instructions, when executed by at least one processor, may cause the processor to perform functions corresponding to the instructions. The computer-readable storage medium may be, for example, a memory. At least a part of the program module may, for example, include a module, a program, a routine, sets of instructions, or a processor for performing one or more functions.

The computer-readable storage medium may include a hard disc, a floppy disc, a magnetic medium such as a magnetic tape, an optical medium such as a compact disc read only memory (CD-ROM) or a digital versatile disc (DVD), a magneto-optical medium such as a floptical disk, a hardware device, such as a read only memory (ROM), a random access memory (RAM), or a flash memory, which is specially configured to store and execute program instructions (e.g., program module). Further, the program instructions may include not only machine language codes generated by a complier but also computer-executable high-level codes that can be executed using an interpreter. The hardware device may be configured to operate as one or more software modules for operations according to various embodiments, and vice versa.

According to the disclosure, a module or a program may include at least one of the above-described elements, may exclude some of the above-described elements, or may further include additional other elements. According to the disclosure, operations performed by the module, the program, or another element may be carried out sequentially, in parallel, repeatedly, or heuristically, or one or more of the operations may be executed in a different order or omitted, or one or more other operations may be added.

Various embodiments of the disclosure described and shown in the specification and the drawings have been presented to easily explain the technical contents of the disclosure and help understanding of the disclosure, and are not intended to limit the scope of the disclosure. Therefore, the scope of the disclosure should be construed to include, in addition to the embodiments disclosed herein, all changes and modifications derived on the basis of the technical idea of the disclosure.

The invention claimed is:

1. An electronic device comprising:
a first structure including a first plate having a first surface and a second surface opposite the first surface;
a second structure including a second plate facing the second surface of the first plate, a first side wall perpendicular to the second plate, a second side wall perpendicular to the first side wall and the second plate, and a third side wall perpendicular to the first side wall and the second plate and parallel with the second side wall in which the first side wall has a conductive portion, and the second plate, the first side wall, the second side wall, and the third side wall form a trough having an open side to accommodate at least a portion of the first structure, the first structure can move between an open state and a closed state with respect to the second structure in a first direction parallel with the second plate and the second side wall, and the second structure is positioned at a first distance from the first side wall when the first structure is in the closed state, and is positioned at a second distance larger than the first distance from the first side wall in the open state;
a display layer being a flexible display touch screen layer, having a flat portion extending across at least a portion of the first surface and mounted on the first surface and a bendable portion extending in a space between the first side wall and the first structure from the flat portion in the closed state in which when the first structure is moved into the open state from the closed state, at least a portion of the bendable portion forms a substantially flat surface between the flat portion and the first side wall when seen from above the first plate;
a conductive pattern mounted on the second plate between the second surface and the second plate;
a first conductive path extending between the conductive portion of the first side wall and the conductive pattern;
a printed circuit board mounted in the first structure;
a wireless charging circuit mounted on the printed circuit board;
a wireless communication circuit mounted on the printed circuit board; and
flexible conductive paths connected between the printed circuit board and the conductive pattern and including a second conductive path electrically connected between the wireless charging circuit and the conductive pattern and a third conductive path electrically connected between the communication circuit and the first conductive path.

2. The electronic device of claim 1, further comprising a cable including the flexible conductive path.

3. The electronic device of claim 1, further comprising a flexible printed circuit board including at least a portion of the flexible conductive path.

4. The electronic device of claim 1, wherein the flexible conductive path can be moved between the open state and the closed state, and
   the flexible conductive path can be bent at different angles between the open state and the closed state.

5. The electronic device of claim 1, wherein the conductive pattern includes a wireless charging antenna and/or a wireless communication antenna.

6. The electronic device of claim 1, wherein the conductive portion includes an outer metal frame operating as an antenna radiator.

7. The electronic device of claim 1, wherein the conductive pattern further includes a first shielding material layer, and
   the conductive portion further includes a second shielding material layer.

* * * * *